US010992250B2

(12) United States Patent
Ayers et al.

(10) Patent No.: US 10,992,250 B2
(45) Date of Patent: Apr. 27, 2021

(54) INTEGRATED PHOTOVOLTAIC MODULE MOUNTING SYSTEM FOR USE WITH TUFTED GEOSYNTHETICS

(71) Applicant: Watershed Solar LLC, Alpharetta, GA (US)

(72) Inventors: Michael R. Ayers, Johns Creek, GA (US); S. Kyle Ehman, Milton, GA (US); Neta Reef, Beit Elazari (IL); Sharone Zehavi, Cupertino, CA (US)

(73) Assignee: Watershed Solar, LLC, Alpharetta, GA (US)

( * ) Notice: Subject to any disclaimer, the term of this patent is extended or adjusted under 35 U.S.C. 154(b) by 0 days.

(21) Appl. No.: 16/013,616

(22) Filed: Jun. 20, 2018

(65) Prior Publication Data

US 2018/0367087 A1 Dec. 20, 2018

Related U.S. Application Data

(60) Provisional application No. 62/522,402, filed on Jun. 20, 2017, provisional application No. 62/616,705, filed on Jan. 12, 2018.

(51) Int. Cl.
*H02N 6/00* (2006.01)
*H01L 31/042* (2014.01)
(Continued)

(52) U.S. Cl.
CPC .............. *H02S 20/10* (2014.12); *F24S 25/13* (2018.05); *F24S 25/33* (2018.05); *F24S 25/61* (2018.05); *F24S 25/632* (2018.05); *F24S 25/634* (2018.05); *F24S 25/636* (2018.05); *H01L 31/0475* (2014.12); *H02S 20/20* (2014.12);
(Continued)

(58) Field of Classification Search
CPC .......... H02S 20/10; H02S 20/20; H02S 20/30; H02S 30/10; H01L 31/02366; F24S 25/61
See application file for complete search history.

(56) References Cited

U.S. PATENT DOCUMENTS 8,403,597 B2   3/2013   Ayers
8,585,322 B2   11/2013  Ayers
(Continued)

OTHER PUBLICATIONS

PCT/US18/38556, International Search Report, dated Nov. 15, 2018.
PCT/US18/38556, Written Opinion, dated Nov. 15, 2018.

*Primary Examiner* — Angelo Trivisonno
(74) *Attorney, Agent, or Firm* — Baker Donelson; Carl M. Davis, II; Dorian B. Kennedy

(57) ABSTRACT

A mounting system 110 for a solar panel 11 includes a base plate 114 having an elongated mounting slot 116, a spacer beam 124 with a slot 128, a first T-shaped fastener 131 having a mounting plate 132 with a width slightly smaller than the size of the slot and a length larger than the size of the slot, so that the mounting plate may be passed through the slot and then rotated so that it then cannot pass back through the slot. A second T-shaped fastener 137 having the same configuration couples the solar panel to the spacer. The system optionally has a ballast system 145 which includes a ballast tray 146 and third T-shaped fastener 155 of the same configuration for coupling the tray to the base plate. An anti-creep strip 161 is coupled to the base member through fourth T-shaped fasteners 162 of the same configuration.

22 Claims, 19 Drawing Sheets

(51) Int. Cl.
| | |
|---|---|
| *H02S 20/10* | (2014.01) |
| *H02S 30/10* | (2014.01) |
| *F24S 25/13* | (2018.01) |
| *F24S 25/33* | (2018.01) |
| *F24S 25/636* | (2018.01) |
| *F24S 25/61* | (2018.01) |
| *F24S 25/632* | (2018.01) |
| *H01L 31/0475* | (2014.01) |
| *H02S 20/20* | (2014.01) |
| *F24S 25/634* | (2018.01) |
| *H02S 20/25* | (2014.01) |
| *H02S 40/22* | (2014.01) |
| *H02S 40/42* | (2014.01) |
| *F24S 25/60* | (2018.01) |
| *F24S 25/20* | (2018.01) |

(52) U.S. Cl.
CPC .............. *H02S 20/25* (2014.12); *H02S 30/10* (2014.12); *H02S 40/22* (2014.12); *H02S 40/425* (2014.12); *F24S 25/20* (2018.05); *F24S 2025/6003* (2018.05); *F24S 2025/6005* (2018.05)

(56) References Cited

U.S. PATENT DOCUMENTS

| | | |
|---|---|---|
| 10,581,374 B2 | 3/2020 | Urruita |
| 2008/0069642 A1 | 3/2008 | Ayers |
| 2011/0197524 A1 | 8/2011 | Sahlin |
| 2011/0277296 A1 | 11/2011 | Ramos |
| 2011/0277805 A1 | 11/2011 | Gillenwater |
| 2013/0056595 A1* | 3/2013 | Tomlinson .............. H02S 20/00 248/176.1 |
| 2013/0199755 A1 | 8/2013 | Sawafta |
| 2014/0083028 A1 | 3/2014 | Richardson |
| 2014/0173978 A1 | 6/2014 | Kim |
| 2015/0129517 A1 | 5/2015 | Wildes |
| 2016/0065116 A1 | 3/2016 | Conger |
| 2016/0126884 A1 | 5/2016 | Stearns |
| 2016/0226434 A1 | 8/2016 | Tomlinson |
| 2016/0268958 A1 | 9/2016 | Wildes |
| 2017/0111006 A1* | 4/2017 | Vietas .................... F24S 25/30 |
| 2018/0131316 A1 | 5/2018 | Urrurita |
| 2018/0366600 A1 | 12/2018 | Ayers |
| 2018/0367090 A1 | 12/2018 | Ayers |
| 2018/0367093 A1 | 12/2018 | Ayers |

\* cited by examiner

INTEGRATED PHOTOVOLTAIC MODULE MOUNTING SYSTEM FOR USE WITH TUFTED GEOSYNTHETICS

CROSS REFERENCE TO RELATED APPLICATIONS

This application claims the benefit of U.S. Provisional Patent Application Ser. No. 62/616,705 filed Jan. 12, 2018 and entitled Integrated Photovoltaic Module Mounting System For Use With Tufted Geosynthetics. This application also claims the benefit of U.S. Provisional Patent Application Ser. No. 62/522,402 filed Jun. 20, 2017 and entitled Integrated Photovoltaic Module Mounting System For Use With Tufted Geosynthetics.

STATEMENT REGARDING FEDERALLY SPONSORED RESEARCH OR DEVELOPMENT

Not applicable.

TECHNICAL FIELD

This invention relates to an integrated mounting system for photovoltaic modules for use in solar energy collection. In a more specific aspect, this invention relates to a non-ballasted and non-ground penetrating integrated photovoltaic mounting system for use with, and supported by, tufted geosynthetics.

In this application, the following terms will be understood to have the indicated definitions:

"photovoltaic module"—a module which utilizes the generation of voltage when radiant energy (such as solar energy) falls on the module; sometimes referred to as a solar cell.

"tufted geosynthetics"—a system which is adapted to cover waste sites and other environmental closures and which is generally comprised of synthetic grass having synthetic fibers tufted to a backing and a geomembrane. Examples of a tufted geosynthetic cover system are shown in Ayers and Urrutia U.S. Pat. Nos. 7,682,105 and 9,163,375. The term "tufted geosynthetics" is also used to refer to a synthetic turf cover system.

"synthetic grass"—refers to a composite which comprises at least one geotextile (woven or nonwoven) tufted with one or more synthetic yarns or strands and which has the appearance of grass.

"geomembrane"—refers to a polymeric material, such as high density polyethylene, very low density polyethylene, linear low density polyethylene, polyvinyl chloride, etc.

"surface"—refers to a surface which has an angle of slope of zero or more.

"creep"—refers to a behavior of materials (such as soils and geosynthetics) to move or deform slowly under a constant load or stress.

BACKGROUND OF THE INVENTION

Photovoltaic solar modules have historically been mounted by use of a rigid racking system over a variety of surfaces such as rooftops, greenfields and brownfields. These rigid racking systems have not been integrated onto the photovoltaic module. Typical systems include racking structures that the photovoltaic module must be placed upon and then mechanically fastened to the racking structure.

Racking structures are placed in spaced-relation and the racking structures enable orienting the photovoltaic module at an energy-generating efficient angle. However, the spacing limits the number of photovoltaic modules that can be installed in an area because the angling causes shadows. An adjacent rack must be spaced sufficiently that the photovoltaic modules are not within a shadow area.

There is a need in the solar industry for an integrated photovoltaic module in which the mounting mechanism is attached to the photovoltaic module which eliminates the need for a rigid racking system. The integration allows for an economical alternative to a traditional rigid racking system and enables the increasing of the density of the photovoltaic modules placed at a solar energy generation site, thereby increasing the potential generation of electrical power while allowing flexibility of installation by using non-traditional racking installers.

While use of solar as a renewable alternative energy source has "clean energy" favorabilities, there are drawback to such installations. Solar energy generation sites typically require large tracts of land. In some location circumstances, wooded lands are cleared or farm lands are re-purposed for use as solar energy generation sites. Other sites are significantly remote from tie-in connections to the power transmission and distribution grid of power generating and supply companies. These remote sites require capital expenditures to install and maintain transmission lines to the electrical grid and such transmission lines occupy additional land. Also, recent changes in power generation capacity has decreased reliance on coal and increased reliance on cleaner combustion fuels such as natural gas and, alternatively, power plants that generate electricity with turbines operated with steam heated by nuclear fuel sources. The coal-fired power plants nevertheless have large areas of ash holding ponds or storage areas. These areas are subject to closing with covers such as geomembranes that restrict environmental waters, such as rain or other precipitation or surface water flow, from passing through the covered site and leaching into the ground or pond.

Accordingly, there is a need in the art for an improved integrated mounting system for securing photovoltaic modules to a surface for generating solar power. It is to such that the present invention is directed.

SUMMARY OF THE INVENTION

The integrated mounting system of this invention allows for easy installation supported by a tufted geosynthetic on a surface. This combination of the integrated mounting system and tufted geosynthetic results in a lower cost, lower maintenance of the surrounding surface, adaptable for variety of grades from flat to sloping ground and generates more solar power per unit area.

Briefly described, the present invention integrates a photovoltaic module mounting system over tufted geosynthetics on various surfaces (such as a ground cover system, roof, reservoir, pond, etc.). There are two preferred components of this invention that may be combined or used separately within the integrated photovoltaic module mounting system and within any combination thereof.

The first component is one or more anti-creep strip(s) that enhances interface friction between the photovoltaic module and the tufted geosynthetic, while also reducing shearing forces between the photovoltaic module and its mounting surface, thus preventing or substantially preventing sliding forces from mobilizing the module. If desired, a monitoring device can be used to measure the amount of creep.

The second component is a flexible attachment connection which is used, in addition to the anti-creep strip(s), as an additional factor to increase interface friction and to counter potential shearing and uplift forces which could be caused by high wind gusts. The attachment connection can be welded directly to the tufted geosynthetic or the geomembrane and attached to the bottom, top or side of the photovoltaic module. Other means of attaching the connection to the geosynthetic include mechanical means (e.g., screws, bolts, etc.) and adhesive means such as glue, tape, etc.

These two components eliminate the need for ballast compared to a traditional photovoltaic racking system which does not have foundation anchoring. The integrated photovoltaic module mounting system supported by a tufted geosynthetic requires no ballast on a surface. These two components enable multiple configurations (as shown in the drawings).

The result of a non-ballasted integrated photovoltaic module mounting system allows for a lower cost and increased power generation through higher density of module placement at an energy generation site An additional advantage of an integrated photovoltaic module mounting system is that the system does not require grounding.

The integrated photovoltaic module mounting system of this invention allows for a higher density (i.e., one or more) of photovoltaic modules in a defined area as compared to traditional systems, and a higher density of modules enables the integrated photovoltaic module mounting system to provide more electrical power per unit area.

More particularly described, the present invention meets the need in the art by providing an integrated photovoltaic module mounting system for use in mounting a photovoltaic module to tufted geosynthetics, comprising at least one elongated base plate and at least one elongated rail, said elongated rail coupled to and longitudinally aligned with said at least one elongated base plate A plurality of photovoltaic module fasteners for coupling said rail with a photovoltaic module, and an anti-creep strip coupled to a bottom surface of said at least one elongated base plate, said anti-creep strip comprising a plurality of spaced-apart feet extending from the bottom surface for positioning on a portion of a tufted geosynthetics having a plurality of tufts with the plurality of spaced-apart feet in frictional engagement therewith, said tufted geosynthetics for covering a surface. The photovotanic module generates electricity and the anti-creep strip inter-engaged with tufts of the tufted geosynthetics resists wind uplift.

In another aspect, the present invention provides an integrated photovoltaic module mounting system for use in mounting a photovoltaic module to tufted geosynthetics, comprising at least one elongated first rail and a photovoltaic module having a connecting bracket configured for coupling to said at least elongated first rail, with a plurality of first fasteners for coupling said at least one elongated first rail with the photovoltaic module, and an anti-creep strip coupled to a bottom surface of said rail, said anti-creep strip comprising a plurality of feet extending from the bottom surface thereof for engaging tufts of a tufted geosynthetic overlying a surface.

In yet another aspect, the present invention provides an integrated photovoltaic module mounting system for use in mounting a photovoltaic module to tufted geosynthetics, comprising at least one elongated base plate having a base member, two opposing side walls each having an inwardly extending lip to define a base plate slot therebetween having a slot width, with a plurality of first fasteners for coupling said at least one elongated base plate with a photovoltaic module, said first fasteners having a mounting plate with a width less than said slot width and a length greater than said slot width. An anti-creep strip couples to a bottom surface of said at least one elongated base plate, said anti-creep strip including a support and a plurality of projections depending downwardly from said support.

In yet another aspect, the present invention provides a method of mounting a photovoltaic module for use with tufted geosynthetics, comprising the steps of:

(a) coupling an anti-creep strip to a bottom surface of an elongated rail;

(b) positioning the anti-creep strip onto a portion of a tufted geosynthetics covering a surface, said anti-creep strip comprising a plurality of spaced-apart feet extending from the bottom surface for positioning on a portion of the tufted geosynthetics having a plurality of tufts with the plurality of spaced-apart feet in frictional engagement therewith; and (c) coupling a photovotanic module to the elongated rail, wherein the photovotanic module generates electricity and the anti-creep strip inter-engaged with the tufts of the tufted geosynthetics resists wind uplift.

Objects, advantages and features of the present invention will become apparent upon a reading of the following detailed description in conjunction with the drawings and the appended claims.

DETAILED DESCRIPTION

The present invention provides an integrated photovoltaic module mounting system for use with a tufted geosynthetic system on a surface without a racking structure and without ballast for support.

The essential components of this invention are a tufted geosynthetic system and one or more integrated photovoltaic module mounting systems.

Cover System

Examples of tufted geosynthetic systems useful in the integrated photovoltaic module mounting system of this invention are the covers marketed by Watershed Geosynthetics LLC under the registered trademarks ClosureTurf and VersaCap. These covers 11 comprise a composite of at least one geotextile 213 which is tufted with a plurality of spaced-apart tufts 215 with one or more synthetic yarns (i.e., a tufted geosynthetic) to simulate grass blades in a synthetic grass, and an impermeable geomembrane 217 comprised of a polymeric material.

The synthetic grass blades of the system may contain an infill material and/or a material for protection of the synthetic grass blades against ultraviolet rays.

Solar Module

One or more mono- or multi-crystalline solar modules can be used in the integrated photovoltaic module mounting system of this invention, such as commercially available polycrystalline silicon solar modules. Examples of effective solar modules are available from BYD (China) under the designation BYD 260P6C-30-DG and from Trina (China) under the designation Solar Duomax TSM-PEG14, Tallmax PE14A, and BYD P6C-36. An alternate embodiment discussed below gainfully uses a bifacial solar module.

Figure 1:
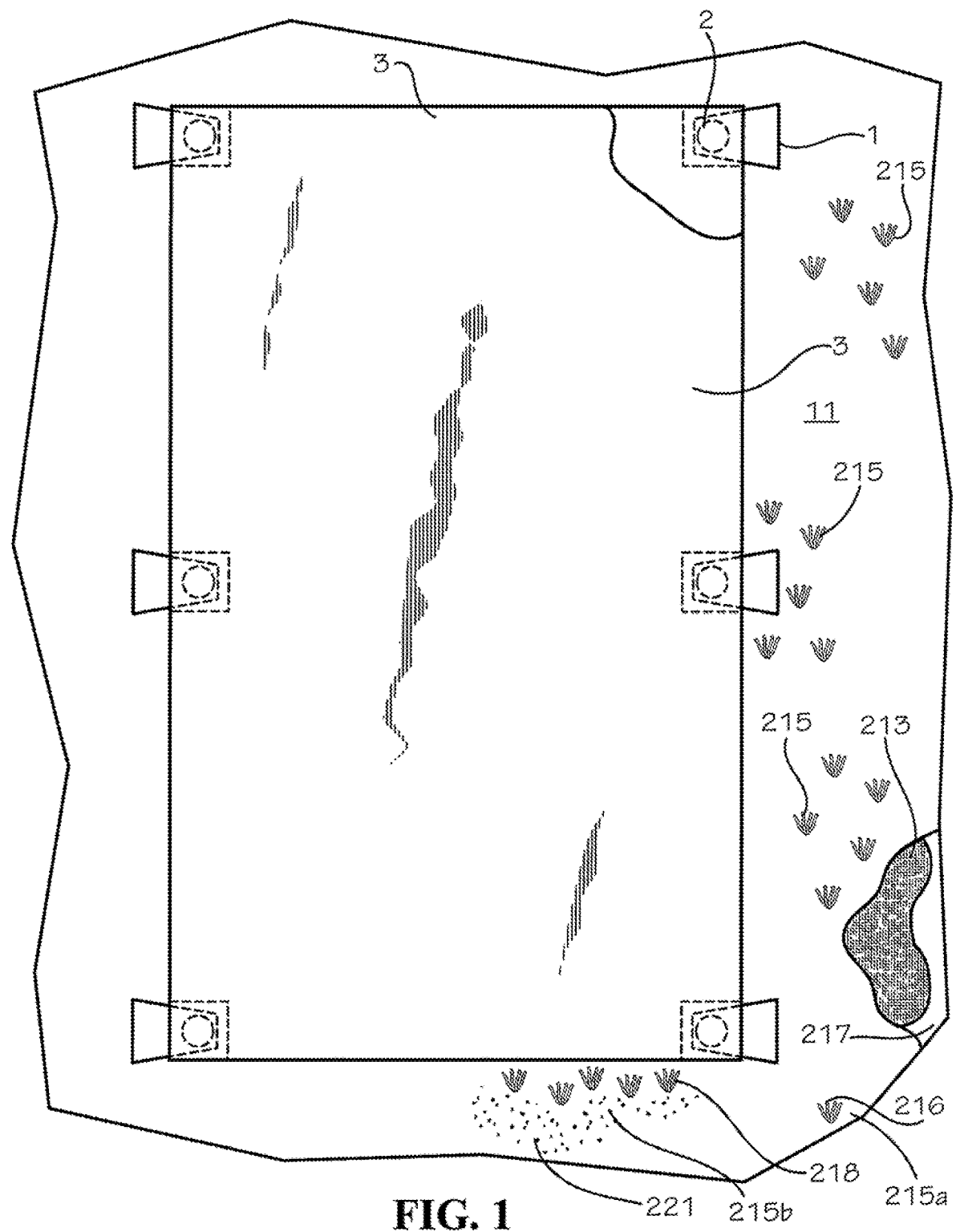
FIG. 1 shows multiple flexible attachment connections (i.e., single weld harnesses) mounted on a photovoltaic module.

Referring now to the drawings, in which like numerals represent like elements, FIG. 1 shows in top view multiple single weld harnesses 1 secured by a mounting baseplate 2 attached to a solar module 3. The weld harnesses 1 or tabs that extend flexibly laterally from a side edge of the solar module 3 and attach to at least some of the plurality of tufts 215. The attaching may be accomplished by mechanically attached such as with a fastener, chemically attached, welding (heat or sonic), or thermoset bonding.

Figure 1A:
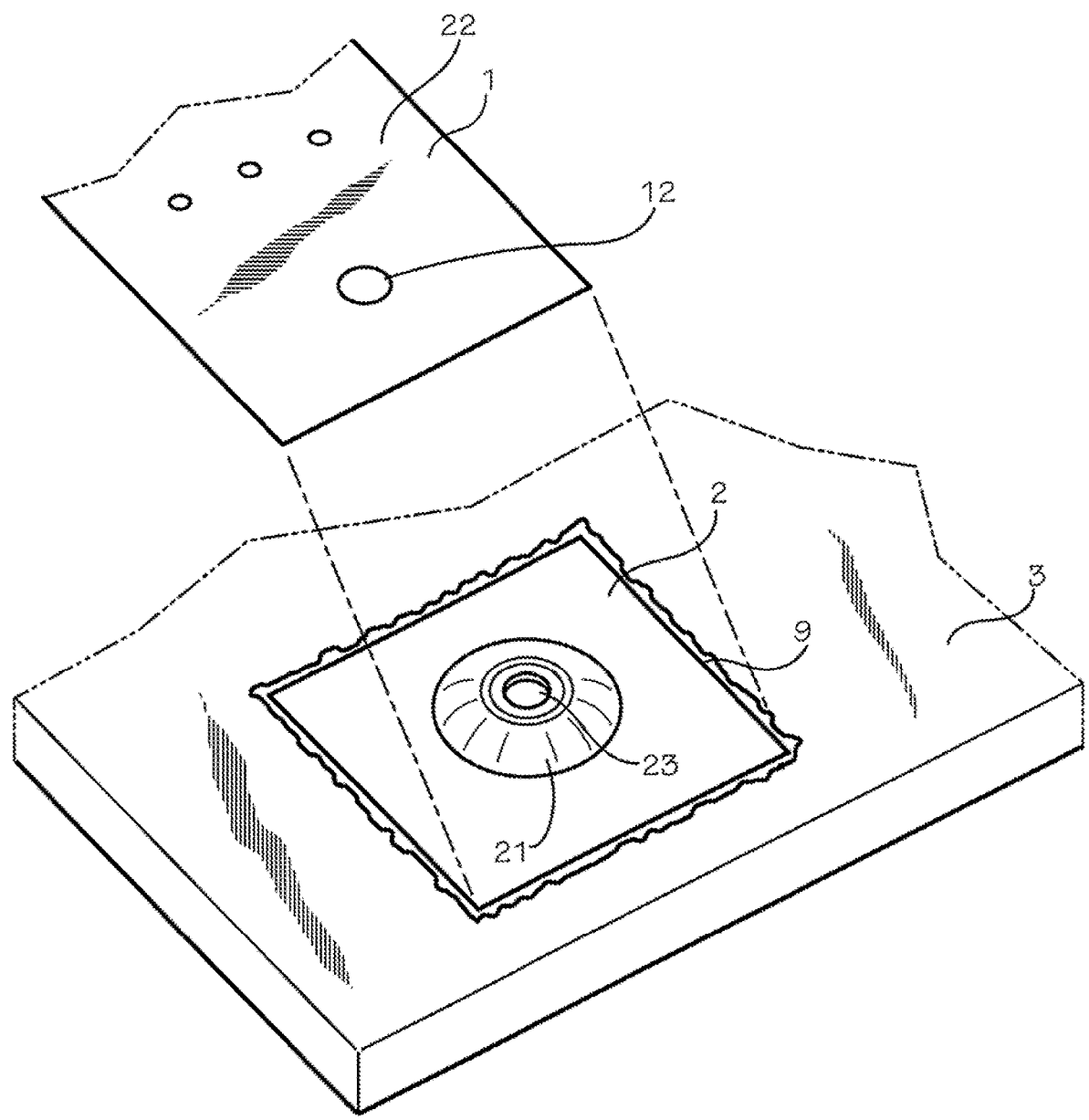
FIG. 1A shows a detailed bottom view of a single flexible attachment connection exploded away from a mounting baseplate attached to photovoltaic solar module.

FIG. 1A shows a detailed bottom view in which a single flexible weld harness 1 is exploded away from the mounting baseplate 2 that attaches, such as with adhesive 9, to a bottom surface of the photovoltaic solar module 3. The flexible weld harness 1 has a first portion 19 that defines an opening 12 for receiving a fastener such as a screw or bolt that engages a threaded passage 23 in the baseplate 2. The threaded passage 23 extends in a raised spacer portion 21 of the baseplate 2, such as a nut mounted therein. A second portion 22 of the flexible attachment connection 1 extends laterally as a flap to overlie and connect (by mechanically linking with a fastener, chemically connecting, heat or sonic welded, thermoset bond or attached, or adhesive) to a portion of a tufted geosynthetic ground cover 11.

Figure 2:
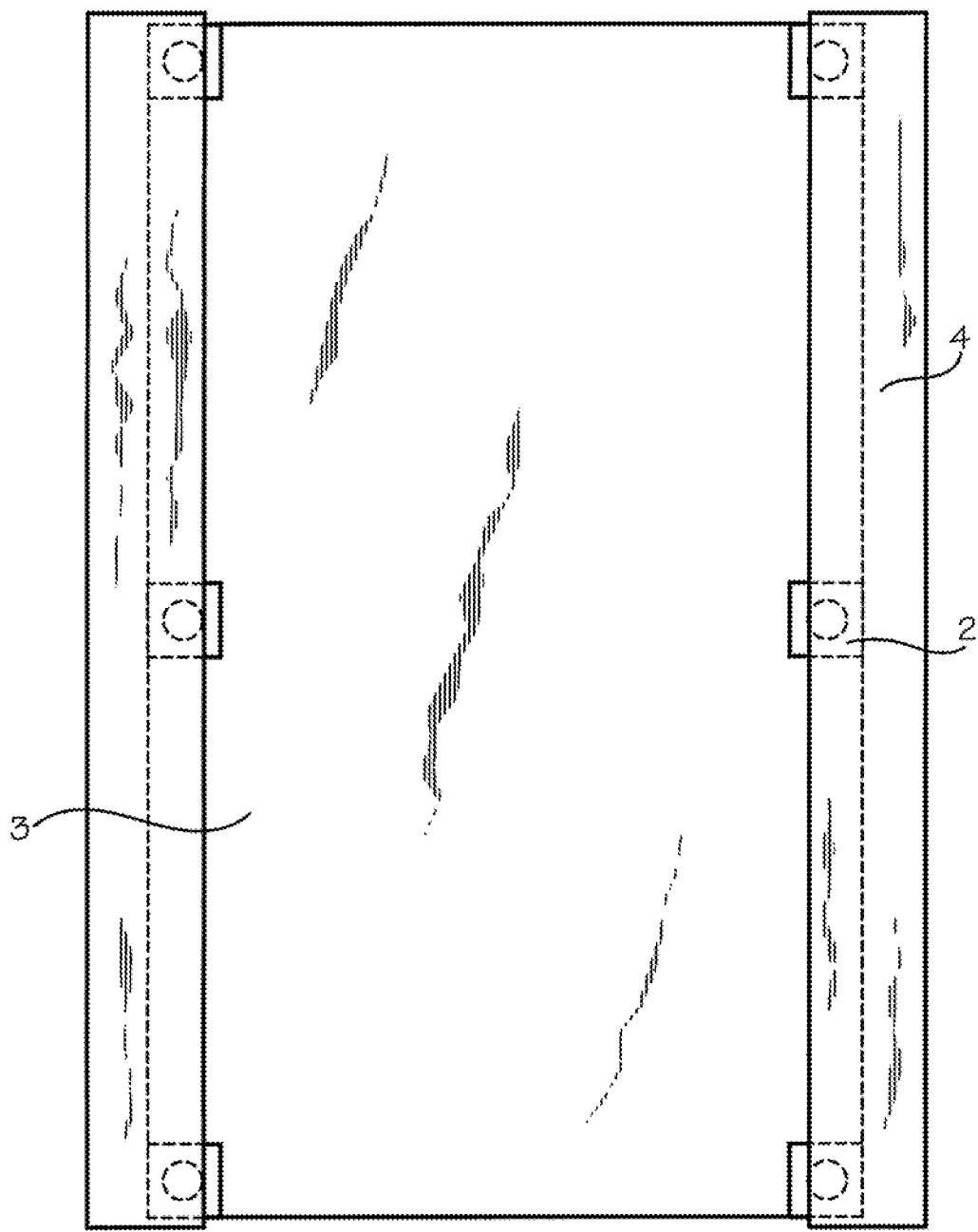
FIG. 2 is a view of multiple weld harness strips mounted on a photovoltaic module.

Instead of a tab 1 for the weld harness, FIG. 2 shows multiple elongated weld harness strips 4 secured by the respective mounting baseplates 2 attached to the solar module 3.

Figure 3:
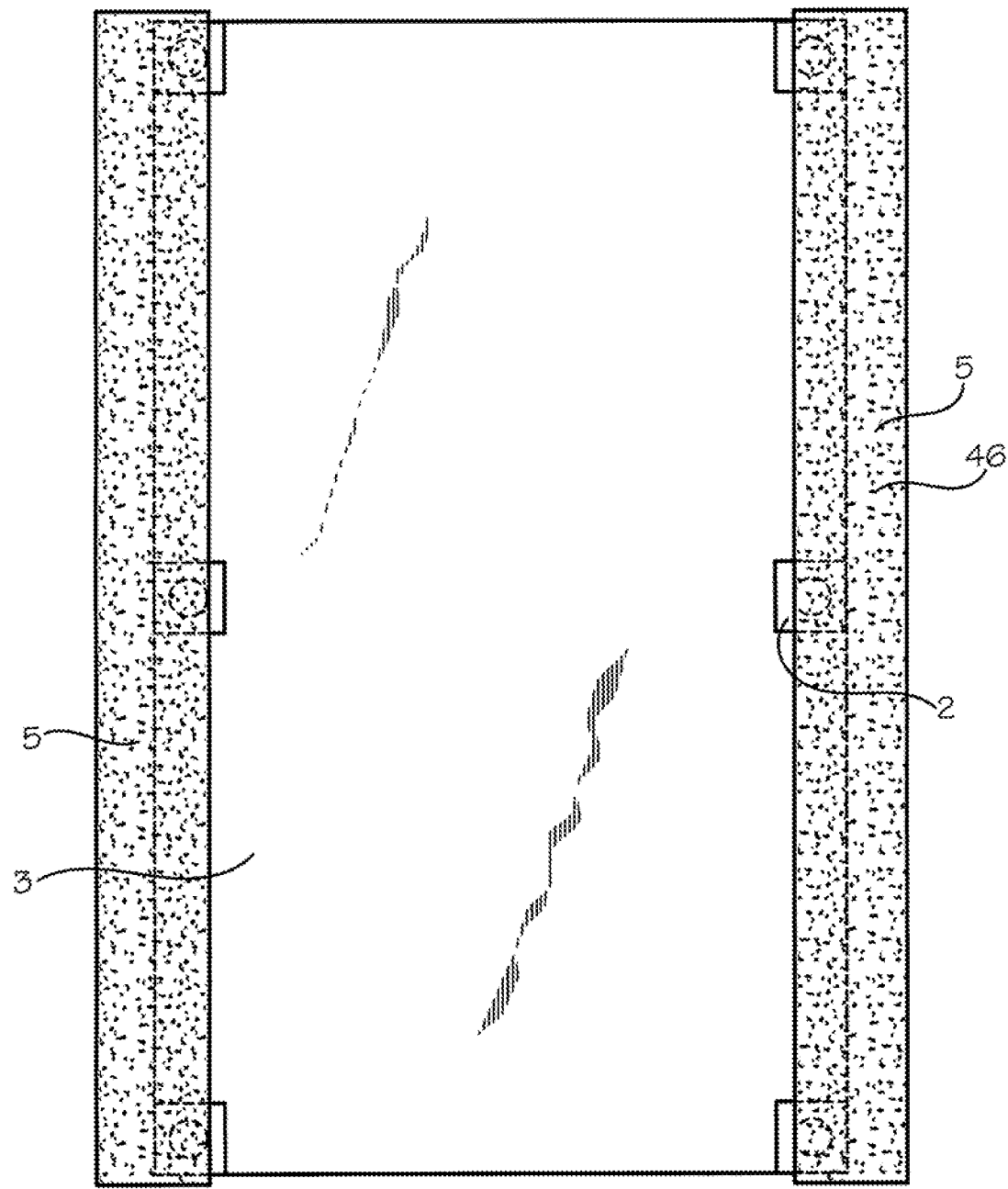
FIG. 3 is a view of two anti-creep strips mounted on a photovoltaic module.

FIG. 3 shows two anti-creep strips 5 secured by the respective mounting baseplates 2 attached to solar module 3.

Figure 4:
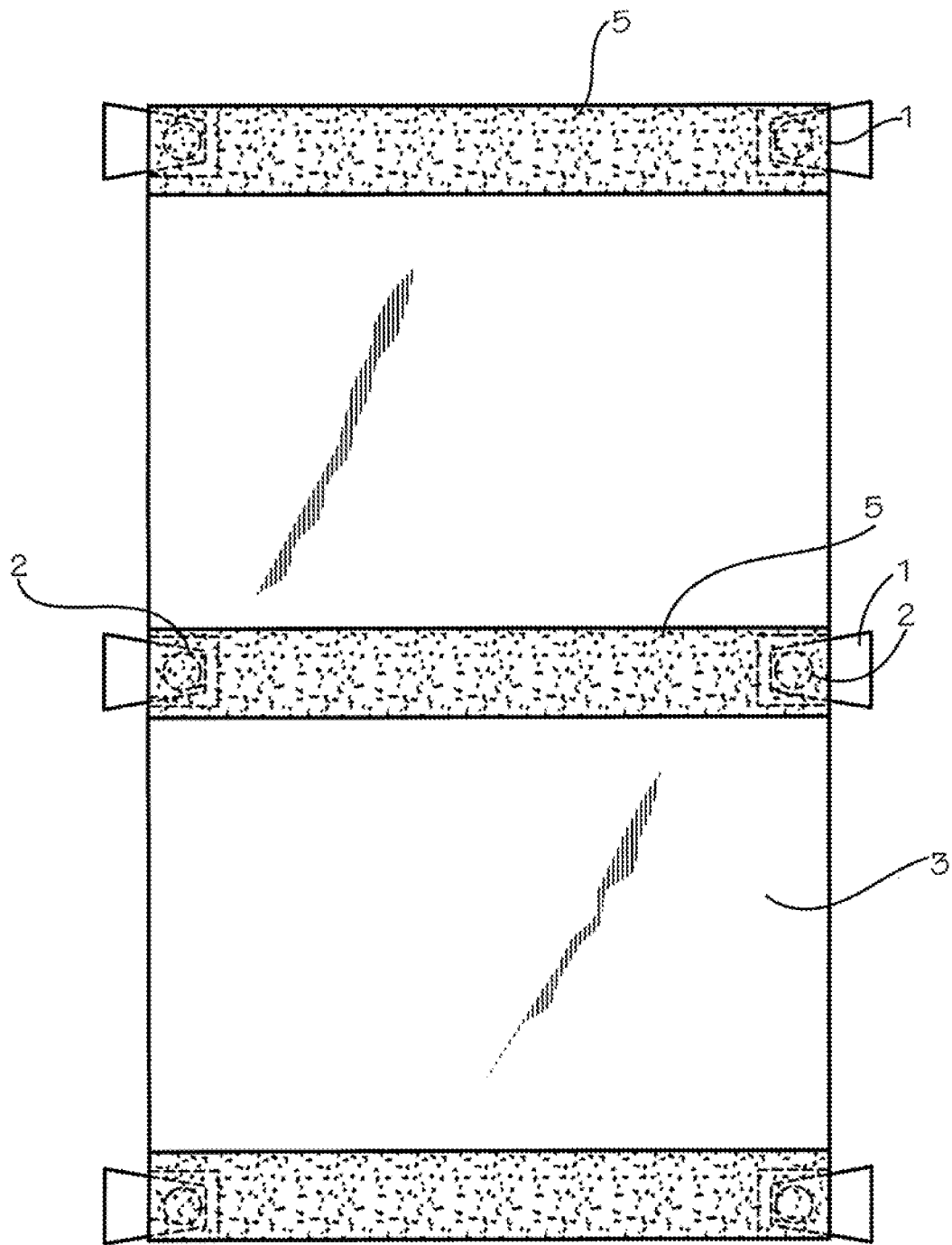
FIG. 4 is a view of multiple single weld harnesses used with multiple anti-creep strips.

FIG. 4 shows multiple single weld harnesses 1 in combination with anti-creep strips 5, both secured by mounting baseplate 2 attached to solar module 3.

Figure 5A:
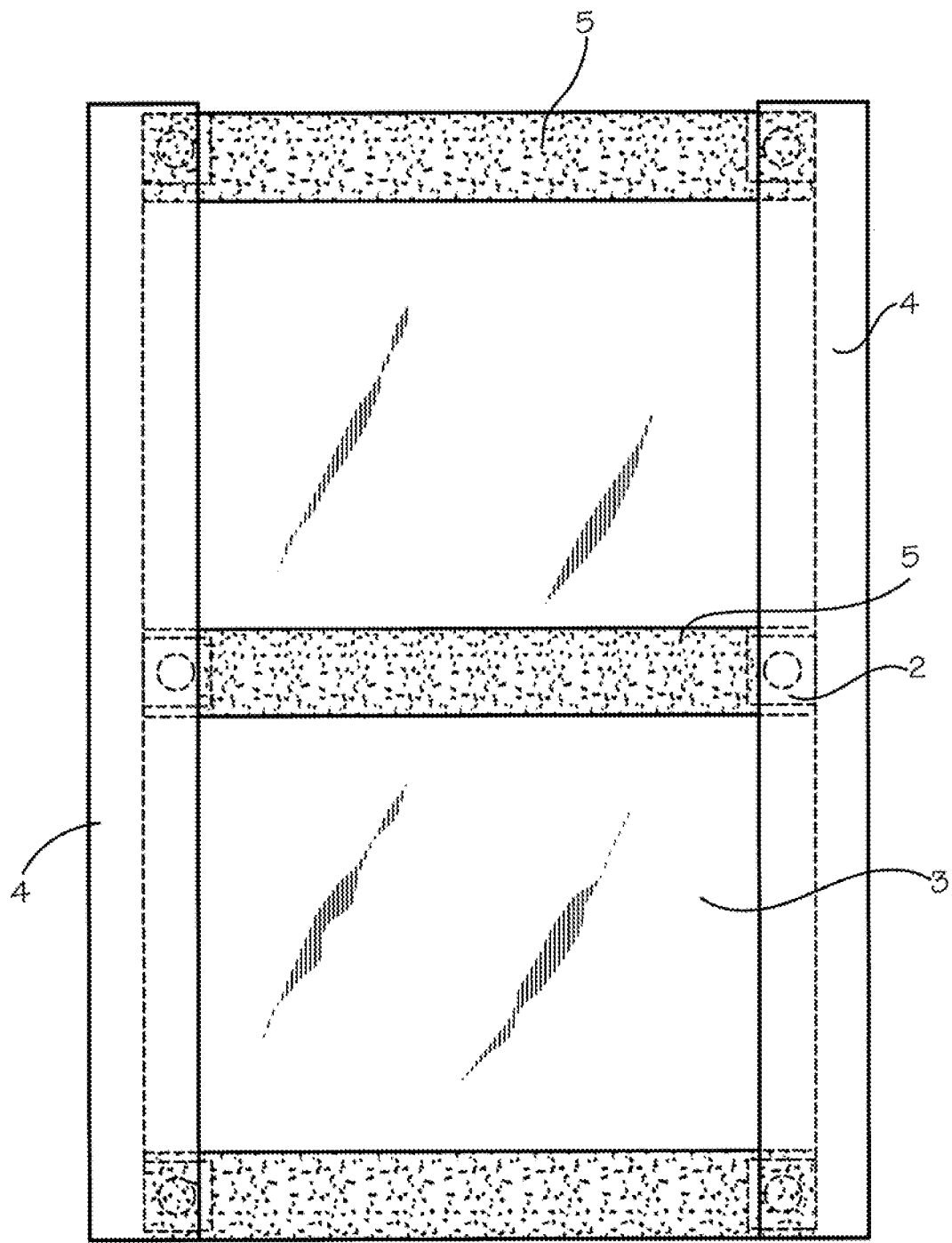
FIG. 5A is a view of two weld harness strips used with multiple anti-creep strips.

FIG. 5A shows two weld harness strips 4 in combination with anti-creep strips 5 secured by mounting baseplate 2 attached to solar module 3.

Figure 5B:
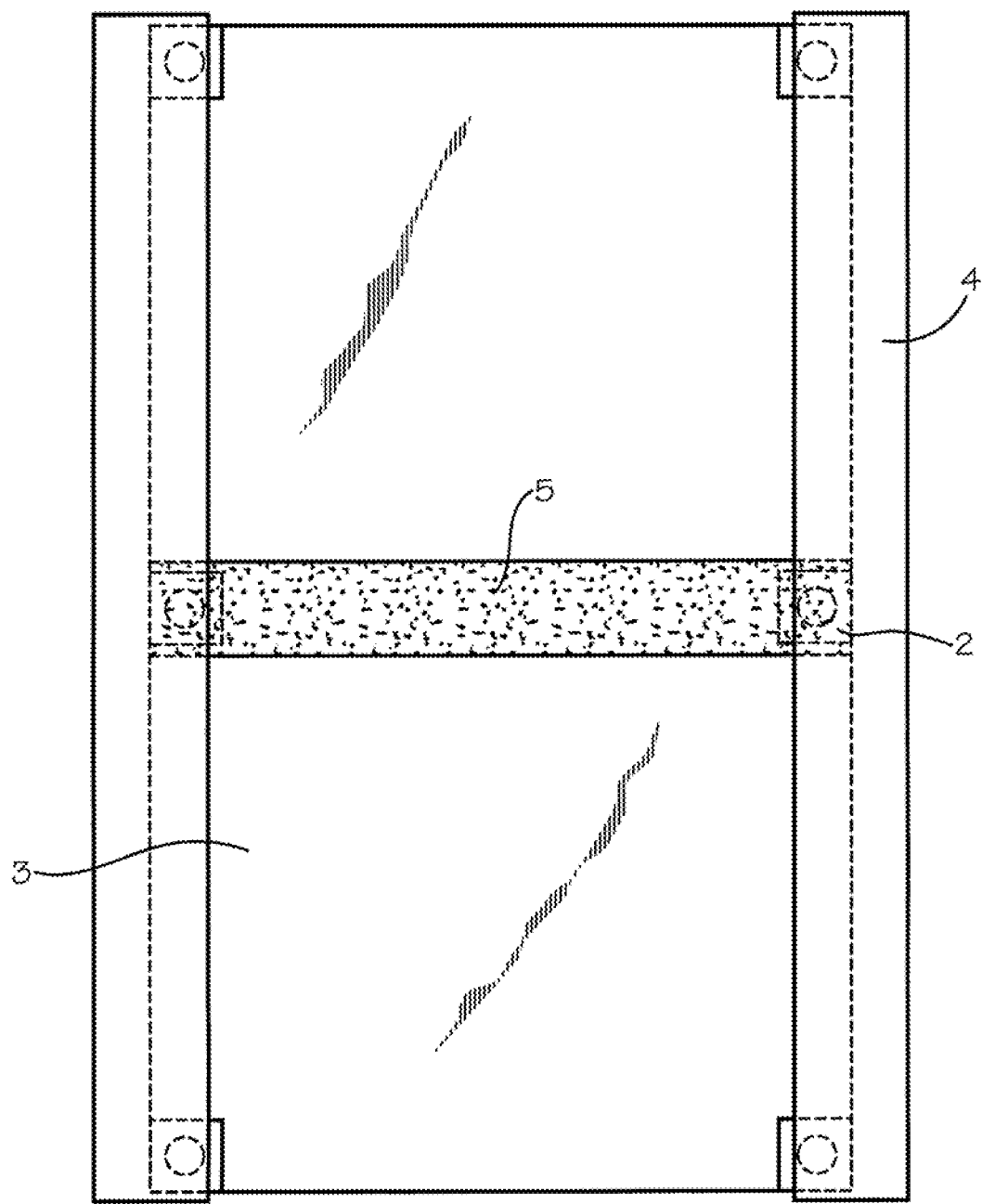
FIG. 5B shows two weld harness strips used with a single anti-creep strip.

FIG. 5B shows two weld harness strips 4 used with single anti-creep strip 5 secured by mounting baseplate 2 attached to solar module 3.

Figure 5C:
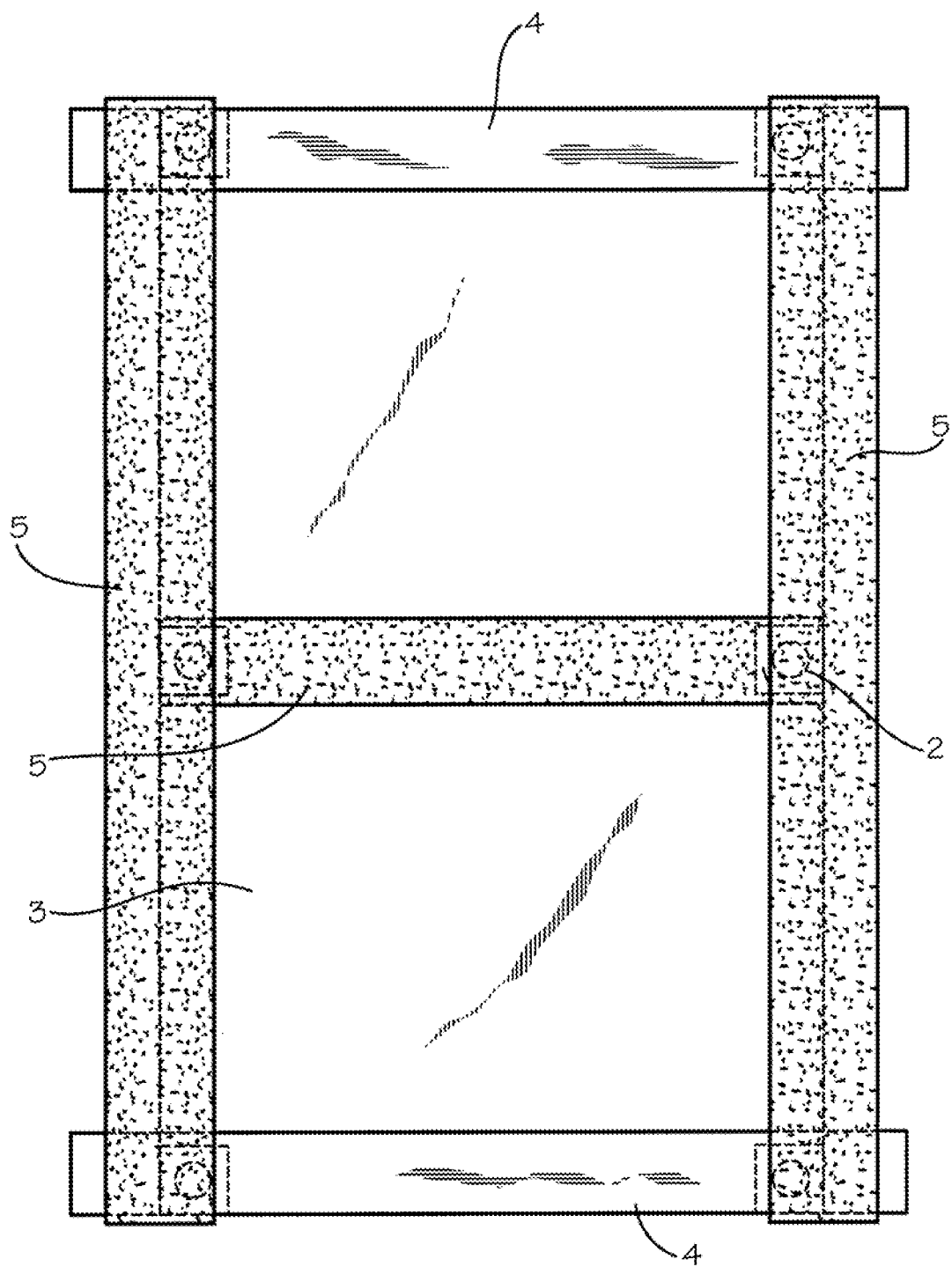
FIG. 5C shows two weld harness strips used with multiple anti-creep strips and multiple single weld harnesses.

FIG. 5C shows two weld harness strips 4 used with multiple anti-creep strips 5 and secured by mounting baseplate 2 attached to solar module 3.

Figure 6:
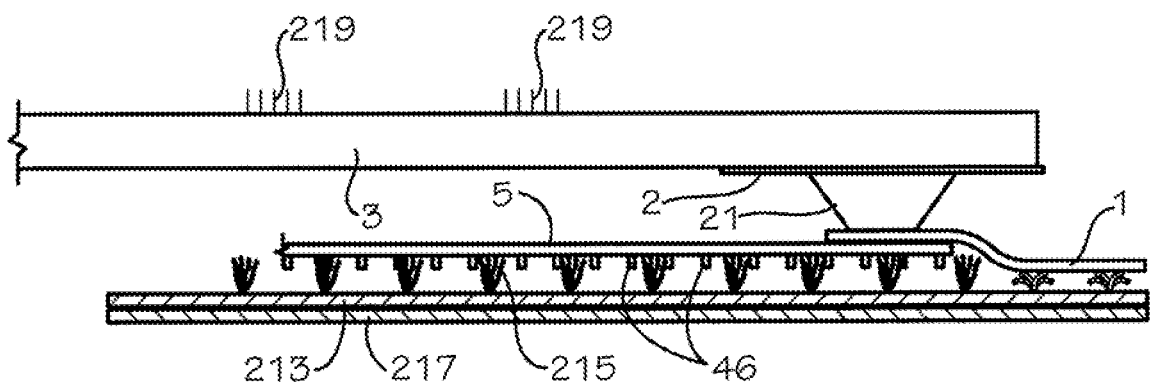
FIG. 6 shows a cross section of a single weld harness strip used with a photovoltaic module.

FIG. 6 shows a side elevational view of a single weld harness 1 secured to solar module 3.

Figure 6A:
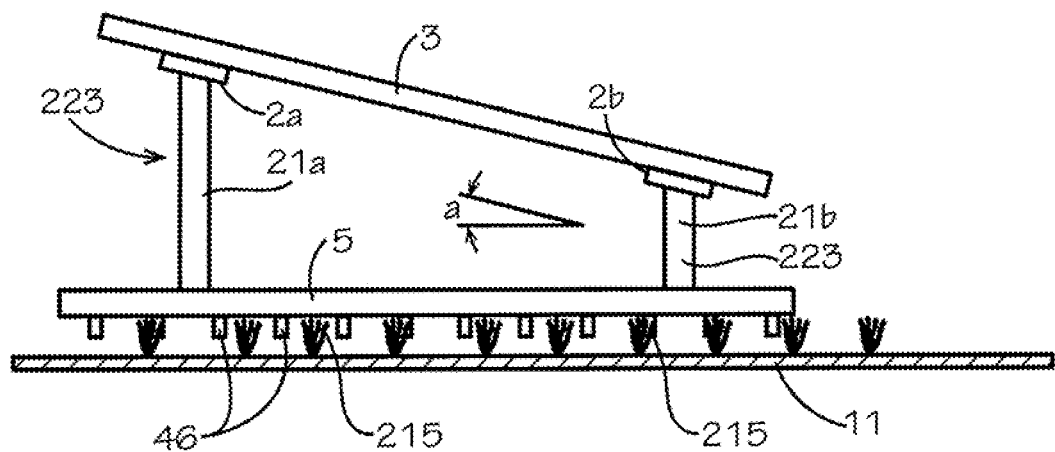
FIG. 6A illustrates in side elevational view an embodiment of the photovoltaic module mounting system using a tilting device for selective orienting at an angle to the geosynthetic for optimal positioning relative to the sun for energy generation.

FIG. 6A illustrates in side elevational view an embodiment of the photovoltaic module mounting apparatus using a tilting device generally 223 for selective orienting of the photovoltaic module 3 at an angle a to the geosynthetic cover 11 for optimal positioning relative to the sun for energy generation.

Figure 7:
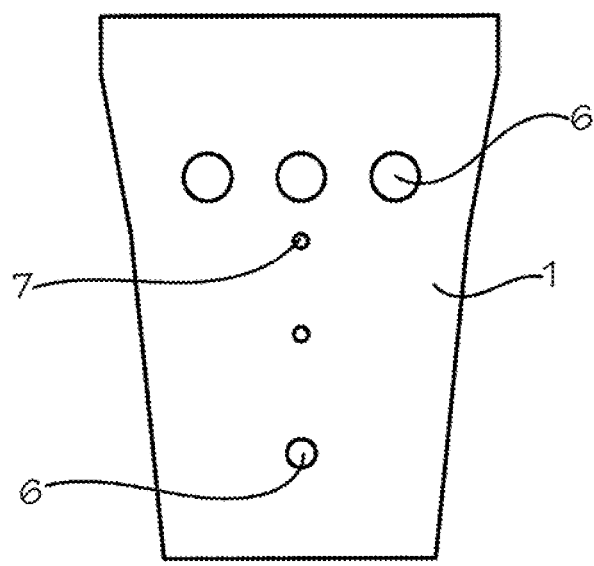
FIG. 7 shows a top view of a single weld harness.

FIG. 7 shows a top view of a single weld harness 1 having a single weld attachment in combination with wind disturbing openings 6 and openings 7 for attaching optional mechanical connections.

Friction

This invention also provides a method for a non-ballasted module mounting system utilizing one or more anti-creep strips 5 integrated on the photovoltaic module when mounted over tufted geosynthetics, by increasing the coefficient of friction between the anti-creep strips and the tufted geosynthetic. The anti-creep strips 5 include a plurality of spaced-apart feet 46 depending from a bottom surface. The feet 46 inter-engage with the tufts 215 to provide frictional connection of the photovoltaic solar module 3 to the tufted geosynthetic cover 11. In the illustrated embodiment, the anti-creep strips 5 connect to the mounting plate 2 using a threaded fastener to engage the threaded passageway 23 in the baseplate 2. In embodiments that uses both the anti-creep strips 5 and the weld harness 1 (or elongated attaching strip 4), the fastener extends through the anti-creep strip and the weld harness and threadably engages the passage 23. Alternatively, separate, or additional baseplates 2 may be used.

The anti-creep strips footing is generally a structured geomembrane or tufted geosynthetic cover 11.

The anti-creep strips, when used in this invention, comprise a polymeric material such as polyethylene, polypropylene, ethylene propylene diene monomer, rubber, metal, textured metal, polyvinyl chloride, polyurethane, etc.

Further, an alternate embodiment may charge the geosynthetic cover 11 with ballast infill 221, to provide a mass that increases the frictional resistance to movement with the plurality of particles of the infill that fill interstices and spaces above the geotextile 213 and among the tufts 215. When used in this invention, suitable materials for infill are sand, concrete and materials available from Watershed Geosynthetics LLC (Alpharetta, Ga.) under the trademarks HydroBinder and ArmorFill. Infill can be of various colors, sizes and textures.

When used in this invention, examples of suitable materials for anti-creep strips are calendared, textured and structural membranes made by Agru America, Inc. under the trademark SureGripnet.

Wind Uplift Resistance

The present invention comprises a wind-resistant non-ballasted integrated photovoltaic module mounting system for use on a tufted geosynthetic, which preferably includes both anti-creep strips and an attachment layer. The system does not rely on weight to resist wind forces, but instead relies on wind-breaking turf blades (i.e., the synthetic grass) and an attachment to the turf blades (synthetic grass). The cover of the present invention can be deployed over a large area with very minor ballasting. Wind-breaking elements 219 may also be utilized to break up the airflow over the integrated photovoltaic module to provide wind uplift resistance. As illustrated in FIG. 6, one or more wind breaking elements generally 219 may attach to an edge of the photovoltaic module 3. The wind breaking elements 219 comprise a plurality of thin spaced-apart pins that extend upwardly, for example, about 1-12 inches, preferably about 2-6 inches, and more preferably, about 2-3 inches. In an alternate embodiment, the weld harness 4 may include wind breaking or disturbing openings 6.

With this invention, the wind velocity on the impermeable surface (geomembrane) becomes turbulent near the surface of the cover, thus greatly reducing the actual wind velocity at the liner surface and decreasing associated uplift. The reaction of the synthetic grass of the tufted geosynthetic to the wind forces can also create a downward force on the geomembrane. This reaction is caused by the filaments of the synthetic grass applying an opposing force against the wind which is transferred as a downward force on the geomembrane.

The integrated photovoltaic module of this invention can be used with an optional tilting device to raise or lower the module for better results depending on the location. FIG. 6A illustrates in side elevational view an embodiment of the photovoltaic module mounting apparatus using the tilting device generally 223 for selective orienting of the photovoltaic module 3 at an oblique angle a relative to the geosynthetic cover 11 for optimal positioning relative to the sun for energy generation. The tilting device 223 comprises at least a pair of the mounting base plates 2a, 2b having riser portions 21a, 21b of different lengths, whereby the photovoltaic module 3 is disposed at the angle a to the geosynthetic cover 11, for optimal energy generation.

Further, the mounting baseplate 2 spaces the photovoltaic solar module 3 from the tufted geosynthetic ground cover 11. The spacing thereby creates a gap between the tufted geosynthetic ground cover and the photovoltaic solar module 3, which gap facilitates air flow therealong for heat dissipation in that heating of the photovoltaic solar module 3 which occurs reduces the solar generation efficiency of the solar module. In an alternate embodiment, the mounting base plate 2 is sized to provide at least an 18 inch to 24 inch gap under the photovoltaic solar module 3. To further enhance solar generation energy capacity, the photovoltaic solar module 3 is bifacial and the tufted geosynthetic ground cover 11 includes light reflective features, such reflectants added into the polymeric used the extrusion of the yarn from which the tufts 215 are formed during tufting. As shown in FIG. 1, tuft 215a illustrates a reflectant 216, for example, a small light-reflecting body or chip. Further, a light reflective color pigment material may be included in the polymeric to enhance reflectivity of ambient light from the tufted geosynthetic ground cover 11 proximate the photovoltaic solar module 3. For example, tufts 215b are tufted with yarns that include a coloring pigment 218.

Figure 8:
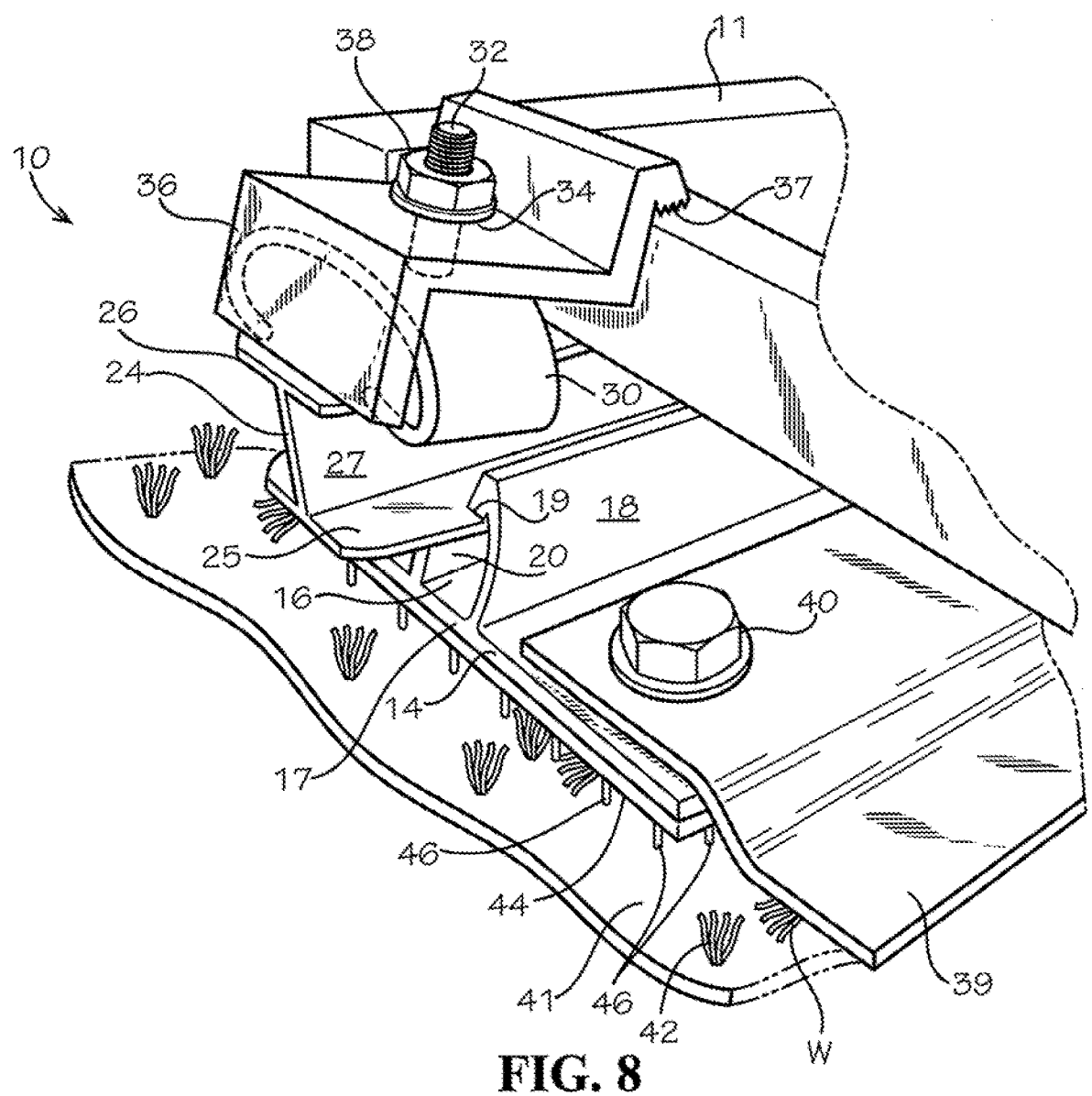
FIG. 8 is a perspective view of the mounting system in another preferred form.

With reference next to FIG. 8, there is a shown a mounting system 10 in another preferred form of the invention. The system 10 is shown mounted to a double glass photovoltaic module or solar panel 11. The system 10 includes an elongated base plate 14 having an elongated mounting channel 16 defined by a generally planar, elongated base member 17, two oppositely disposed elongated, vertically oriented channel walls 18 having inwardly extending clamping tangs 19, and an elongated, vertically oriented central support wall 20. The system also includes an elongated I-beam or rail 24 having a horizontal lower member 25, a horizontal upper member 26 and a vertical spanning member 27 extending between the lower member 25 and upper member 26. The I-beam 24 is selectively, releasably coupled to and slideable relative to the underlying base member 17 for slideable movement therebetween through a force placed upon the I-beam 24. The clamping tangs 19 of the channel walls 18 abut the top surface of the lower member 25 while the lower member rests upon the central support wall 20, thereby holding the I-beam 24 in place relative to the base plate 14.

A C-shaped bracket 30 is slidably coupled to the upper member 26 for selective longitudinal movement along the upper member 26. The C-shaped bracket 30 includes a threaded mounting post or bolt 32 extending upwardly and through a mounting hole 34 within a staggered clamp 36. The staggered clamp 36 includes a contact ledge 37. A nut 38 is threadably coupled to the mounting post 32 to force the contact ledge 37 of the staggered clamp 36 downwardly against the peripheral margin of the solar panel 11, thus locking the position of the solar panel 11. The tightening of the nut 38 upon the post 32 also causes the staggered clamp 36 to be forced downward into abutment with the upper member 26 of the I-beam, thereby locking the position of the C-shaped bracket 30 and staggered clamp 36 relative to the I-beam 24. The base plate 14, I-beam 24, bracket 30, and clamp 36 may all be made of a polymer or metal material, such as aluminum.

Lastly, the mounting system 10 includes a weld harness or weld harness strip 39 and anti-creep strips 44 which are coupled to the base member 17 through bolts 40. As with all embodiments herein, the anti-creep strips 44 include a generally planar support 45 and an array or arrangement of downwardly extending feet or projections 46. The anti-creep strip 44 may be made of a polymer material or the like. The weld harness strip 39 has a first portion 39' which is coupled to the base plate 14, and a second portion 39" which is meltable to the underlying tufted geosynthetic 41.

In use, the weld harness strip 39 overlays a portion of the tufted geosynthetics 41 wherein heat, or other form of welding, is applied to the weld harness strip 39 so that the weld harness strip 39 partially melts or becomes molten and thereby bonds or coupled with the strands or yarns 42 of the geosynthetic material when cooled. The bonding of the weld harness strip 39 to the yarns is depicted by welding reference W.

It should be understood that the geosynthetic material may be used in combination with one or more layers of additional geosynthetic materials.

Figure 9:
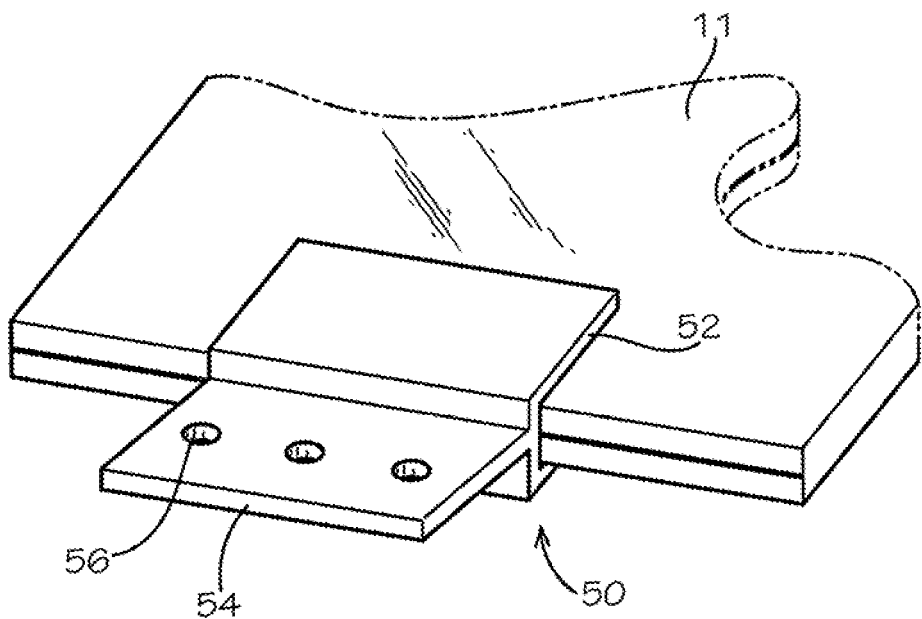
FIG. 9 is a perspective view of the mounting system in another preferred form.
Figure 10:
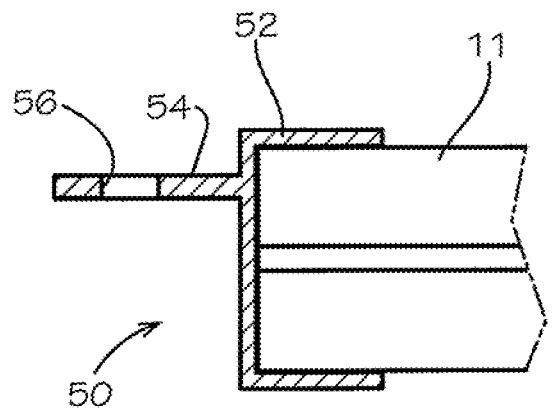
FIG. 10 is a side view of a portion of the mounting system of FIG. 9.

With reference next to FIGS. 9 and 10, there is shown a portion of a double glass solar panel 11 with a side edge mounting bracket 50. Here, the side edge mounting bracket 50 has a U-shaped member 52 and a mounting flange 54 extending laterally and horizontally from the U-shaped member 52. The mounting flange 54 includes one or more mounting holes 56. The member 52 grips a side portion of the solar panel 11, and may be secured thereto with fasteners or adhesive.

The side edge mounting bracket 50 may be coupled to mechanical means shown in FIG. 8. Specifically, the side edge mounting bracket 50 may be coupled to the C-shaped bracket 30 with the mounting post 32 extending through one of the mounting holes 56 of the mounting flange 54 and secured thereto with a mounting nut 38. As with the embodiment of FIG. 8, the C-shaped bracket 30 is coupled to the I-beam 24 which in turn is coupled to the base plate 14. The welding harness strip 39 and anti-creep strip 44 are also utilized to prevent relative movement with respect to the geosynthetic material to which the welding harness strip is mounted. Again, the welding harness strip may be mounted through heat welding, ultrasonic welding, adhesive, or mechanical means such as a nut and bolt. However, heat or ultrasonic welding is preferred as it provides a superior bond between the yarn of the preferred tufted geosynthetic material.

Figure 11:
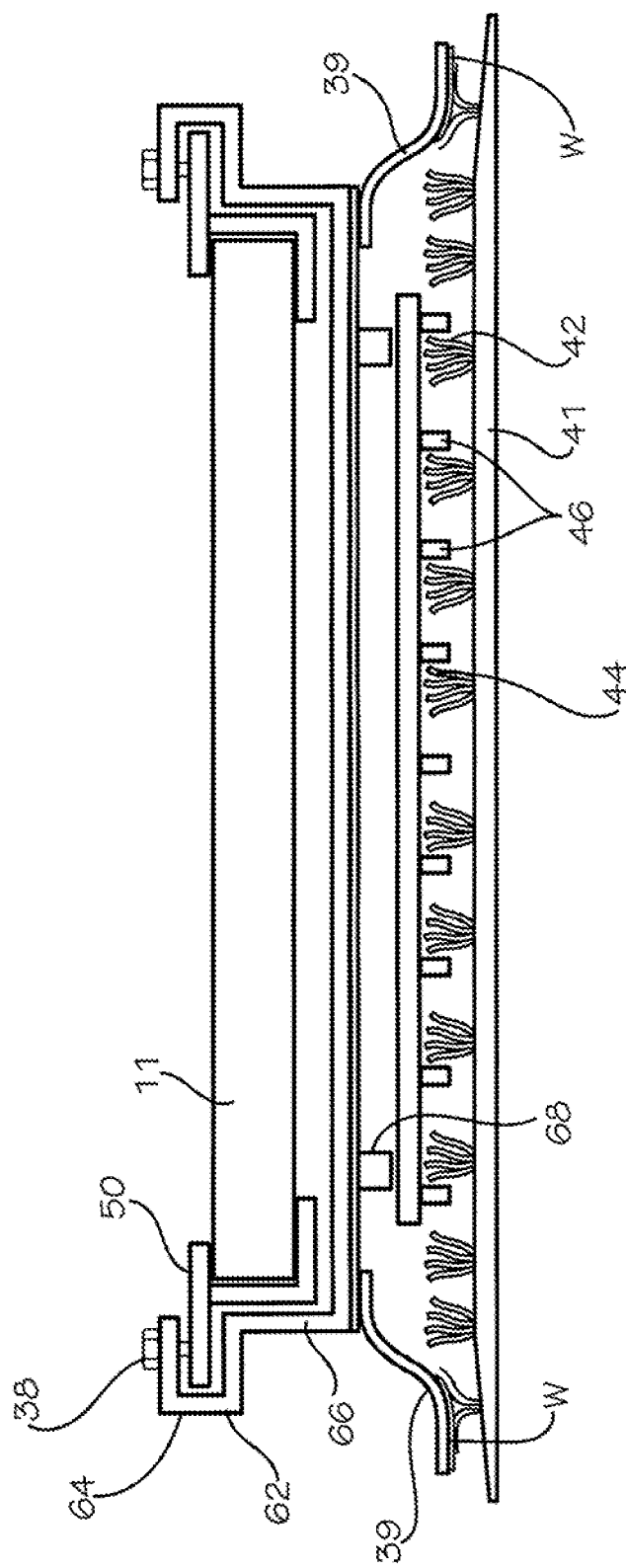
FIG. 11 is a side view of the mounting system in another preferred form.
Figure 12:
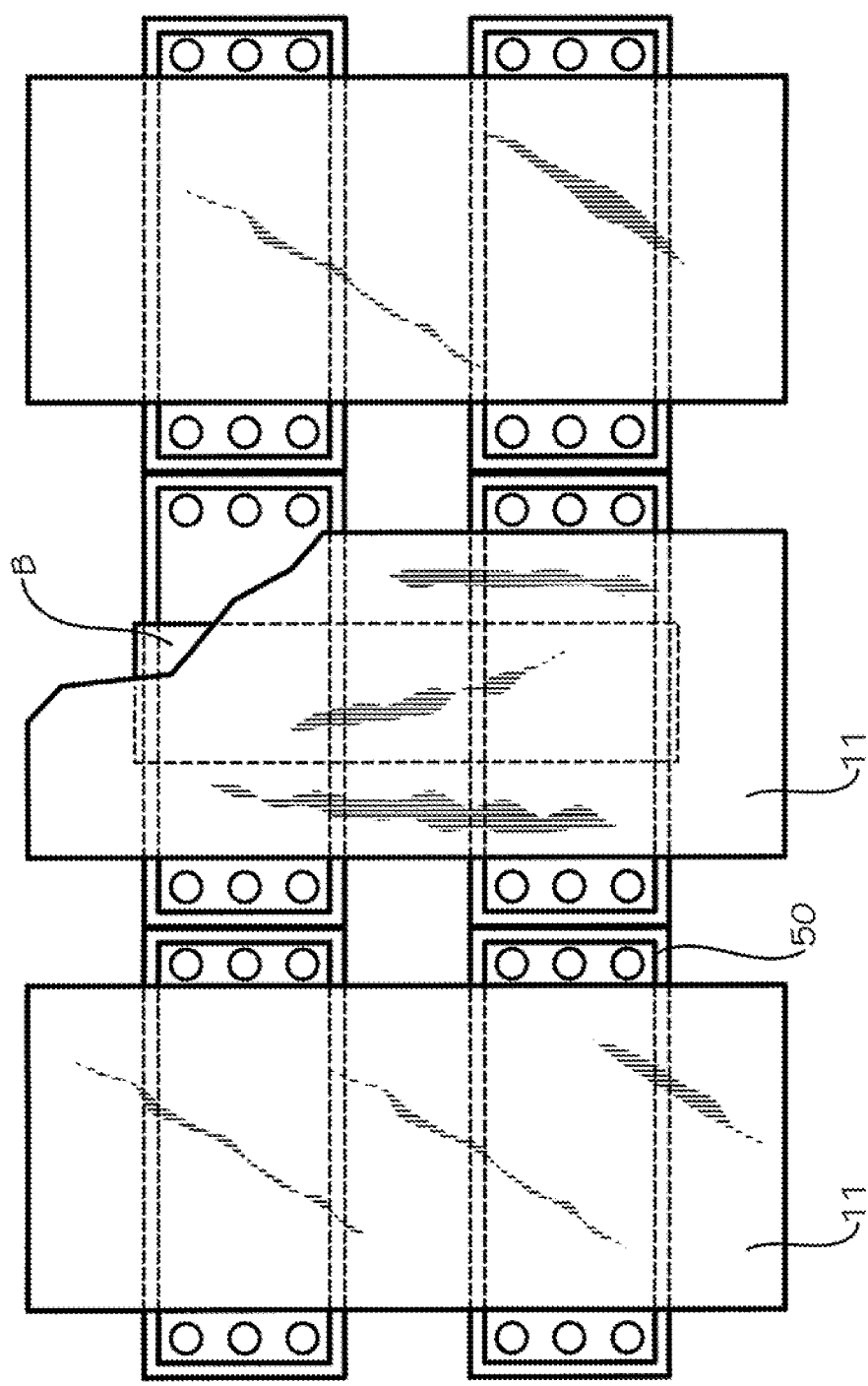
FIG. 12 is a top view of the mounting system of FIG. 11, shown with multiple solar panels mounted together.

With reference next to FIGS. 11 and 12, there is a shown a solar panel 11 and mounting system 60 in another preferred form of the invention. Here, the mounting system 60 includes a side edge mounting bracket 50 similar to that shown in FIGS. 9 and 10. However, the mounting system 60 includes a mounting rail or attachment 62 which essentially replaces the C-shaped bracket 30, I-beam 24 and base plate 14 of the previous embodiments. The mounting bracket 50 is captured within a channel 63 within the mounting attachment 62 so as to be selectively releasably coupled to and slideable relative to the mounting attachment 62. The mounting attachment 62 may be made of any suitable material, such as a metal or polymer.

Here, the mounting attachment 62 includes a top portion 64 which captures the mounting flange 54 of the side edge mounting bracket 50 extendingly attached to the solar panel 11 and is affixed thereto and secured in position through a threaded mounting bolt 38. Optionally, the mounting attachment 62 may be made of a polymer material which allows it to flex, thereby allowing for the solar panel to be snap fitted into the top portion 64 without the need for the use of the mounting post and nut to secure the position of the solar panel 11 to the mounting attachment 62. The top portion 64 extends to and merges with a lower portion or cradle 66 which extends about the side and bottom of the mounting bracket 50. The lower portion 66 may be considered to be an elongated base plate or base portion and is integrally coupled with or extending from the mounting attachment 62. The lower portion 66 includes feet 68 to which the anti-creep strip 44 is coupled through conventional means, such as bolts, screws, or adhesive. The lower portion 66 also includes weld harness strips 39 which are welded W or otherwise coupled to the tufted geosynthetic material, and specifically the yarns of the tufted geosynthetic material, as previously discussed.

The lowest part of lower portion 66 may be considered to be a base plate as it forms the base of the lower portion 66. Therefore, the highest part of lower portion 66, which forms the C-shaped channel about bracket 50, may be considered to be an elongated rail which is integrally formed with or extends from the portion considered to be the base plate.

With this configuration, ballast B, such as elongated weight members, may be easily coupled to the mounting attachment 62 if desired, as shown in FIG. 12.

Multiple mounting attachments may be mounted end to end, as shown in FIG. 12, to form a compart series of solar panels 11 and mounting systems 10.

Figure 13:
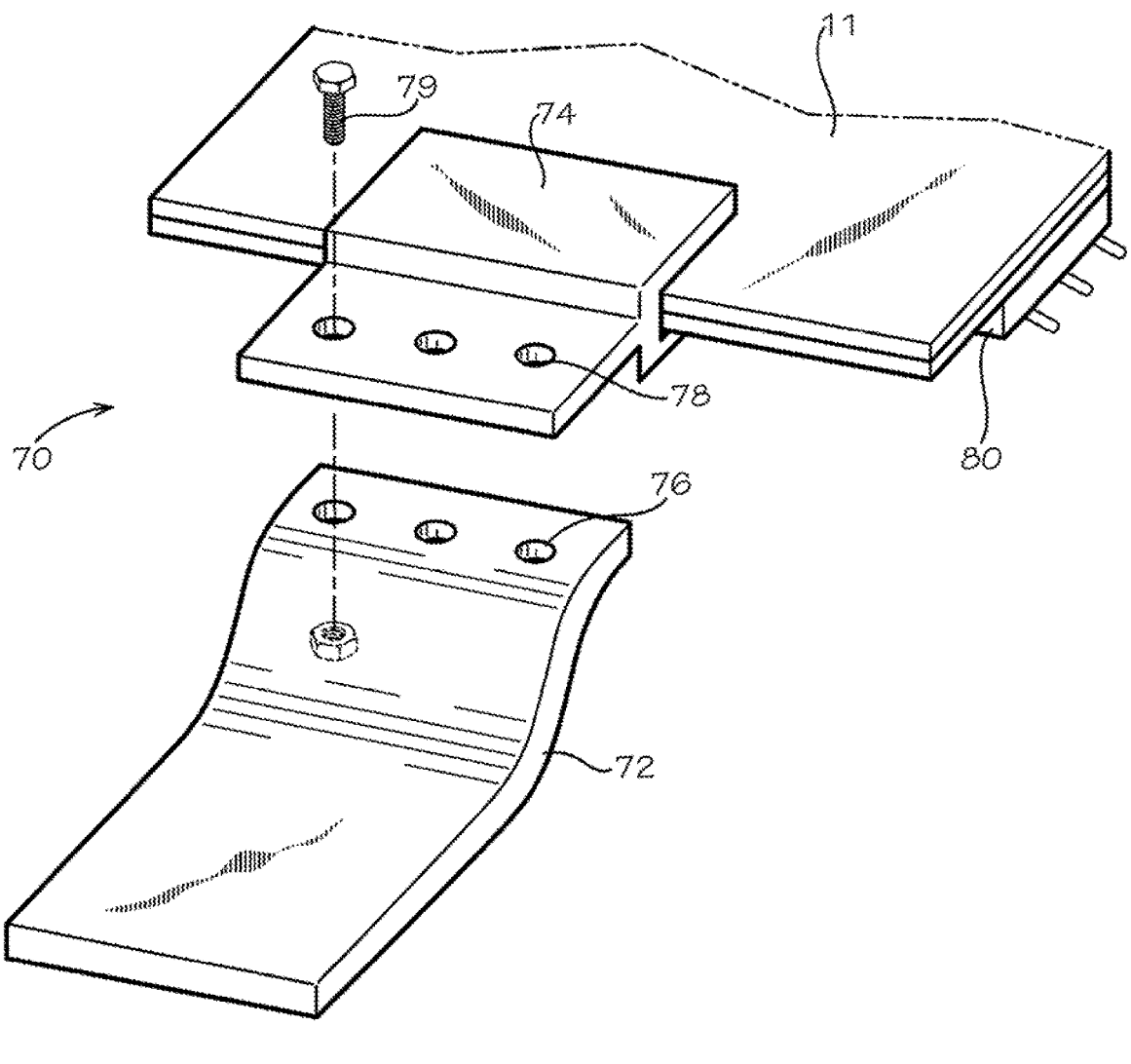
FIG. 13 is a perspective view of the mounting system in yet another preferred form.

With reference next to FIG. 13, there is shown a solar panel 11 and mounting system 70 in another preferred form of the invention. Here, a weld harness strip 72 is mounted directly to a side edge mounting bracket 74. The weld harness strip 72 includes mounting holes 76 which are aligned with mounting holes 78 in the side edge mounting bracket 74. A fastener 79, such as a mounting bolt, is passed through the mounting holes 76 and 78. Anti-creep strips 80 may be attached to the bottom of solar panel 11.

In use, the weld harness strip 72 is once again welded to the strands or yarns of the underlying tufted geosynthetic material, as previously discussed.

Figure 16:
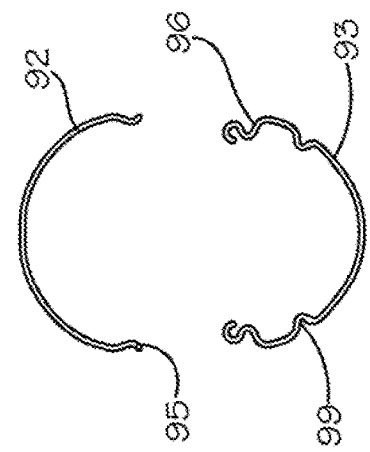
FIG. 16 is an exploded end view of the wiring tray system of FIG. 14.
Figure 14:
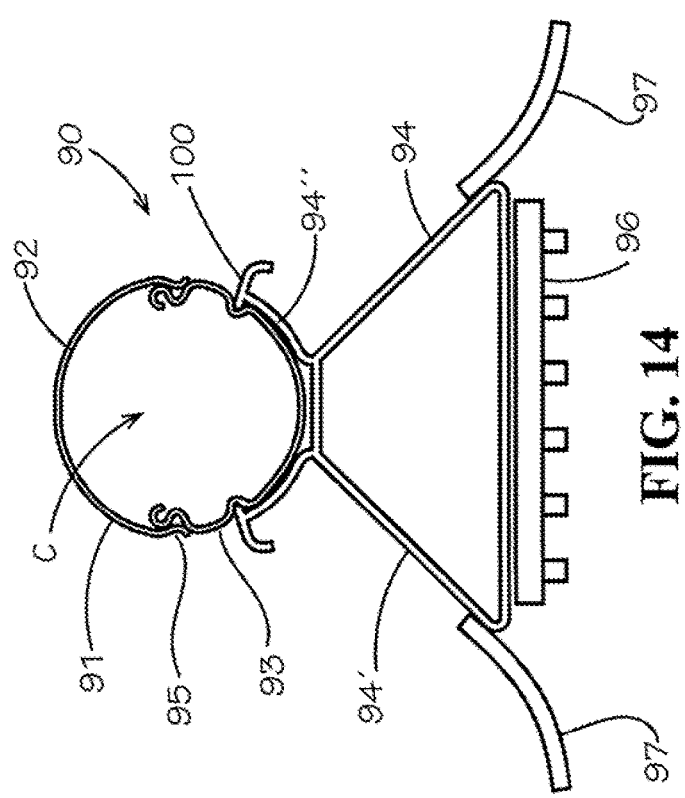
FIG. 14 is an end view of a wiring tray system for solar panels in a preferred form.
Figure 15:
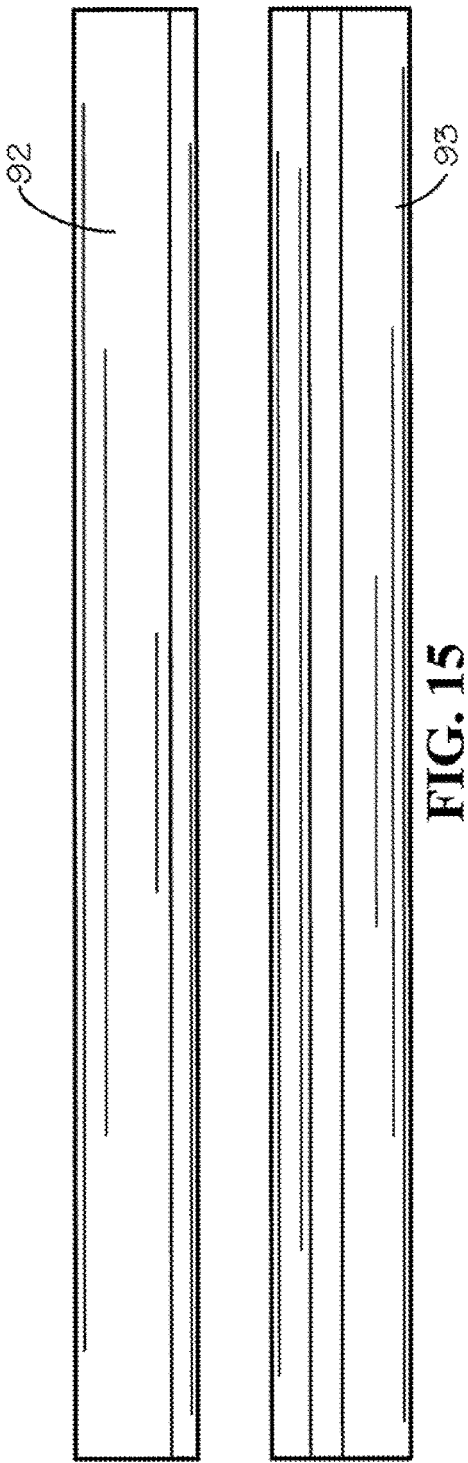
FIG. 15 is a side view of the wiring tray system of FIG. 14.

With reference next to FIGS. 14-16, there is shown a wire tray system 90 for a solar panel mounting system for tufted geosynthetic material in a preferred form of the invention. The wire tray system 90 includes a hollow conduit 91 having a top portion 92 and a bottom portion 93 snap fitted to top portion 92, the conduit 91 forming a channel C through which the wiring of the solar panels may be positioned. The wire tray system 90 also includes a base, foot or stand 94 which is snap fitted to the conduit 91.

The top portion 92 is generally a half cylinder having ends 95 in the form of tangs that are releasably received within longitudinal grooves 96 along the upper ends of the bottom portion 93. The bottom portion 93 also being in the form of a half cylinder and includes longitudinal stand grooves 99.

The stand 94 has a bottom portion 94' is generally triangular in shape and includes an anti-creep strip 96 coupled to the bottom surface of the stand 94. The stand bottom portion 94' also includes oppositely disposed weld harness strips 97. Lastly, the stand bottom portion 94' includes a pair of oppositely disposed longitudinal catches 100 which are configured to be releasably received within the longitudinal grooves 99 of the conduit bottom portion 93.

In use, the weld harness strips are welded or otherwise coupled to the yarn of the tufted geosynthetic material, as previously discussed. Again, the anti-creep strip 96 prevents relative movement of the wire tray system 90 relative to the tufted geosynthetic material.

The conduit top portion 92 may be easily released from the conduit bottom portion 93 to provide easy access to the wiring within the conduit 91. Also, the entire conduit 91 may be easily removed from the stand 94 for replacement purposes.

Figure 17:
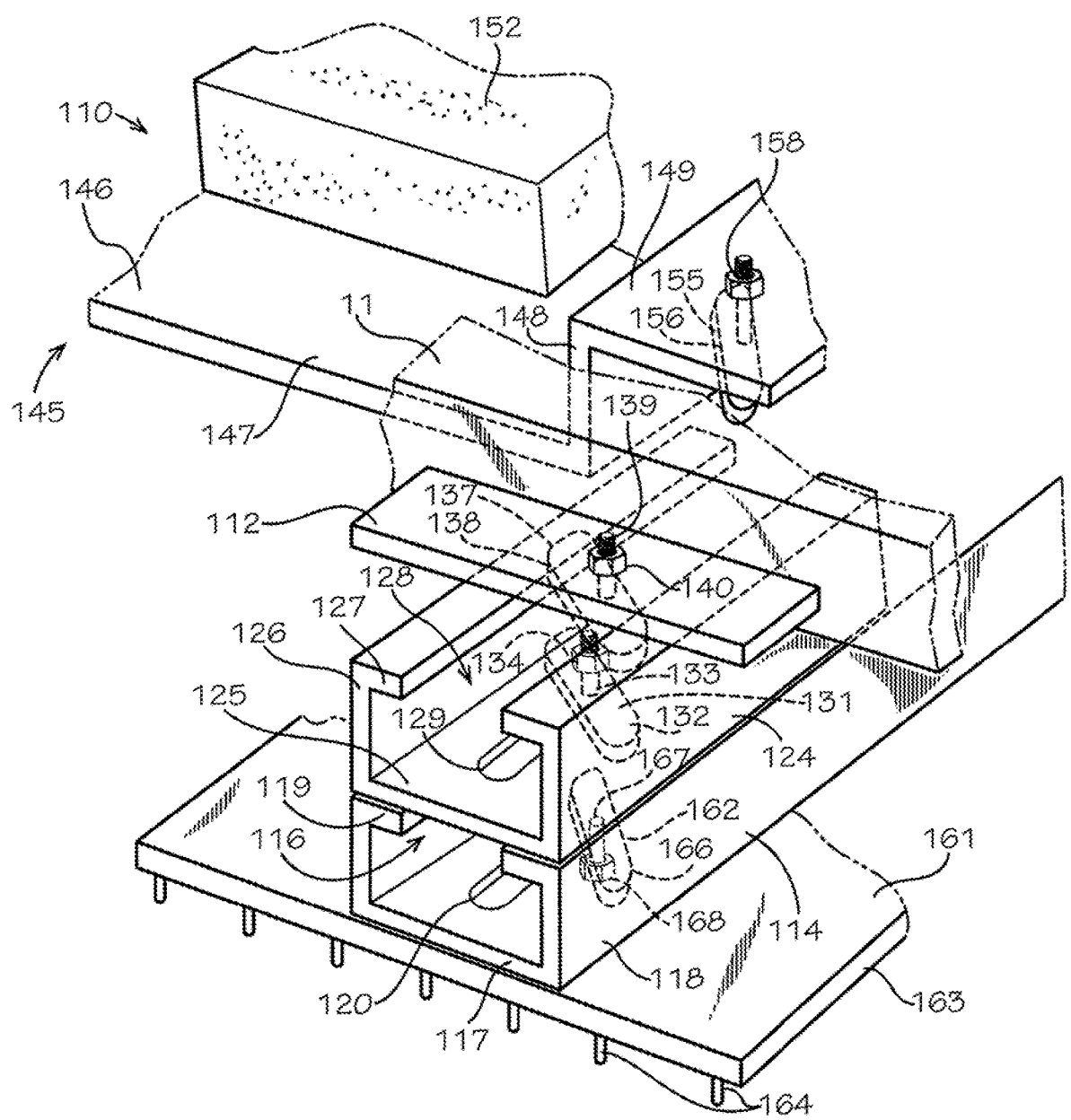
FIG. 17 is a perspective view of a mounting system in yet another preferred form.
Figure 18:
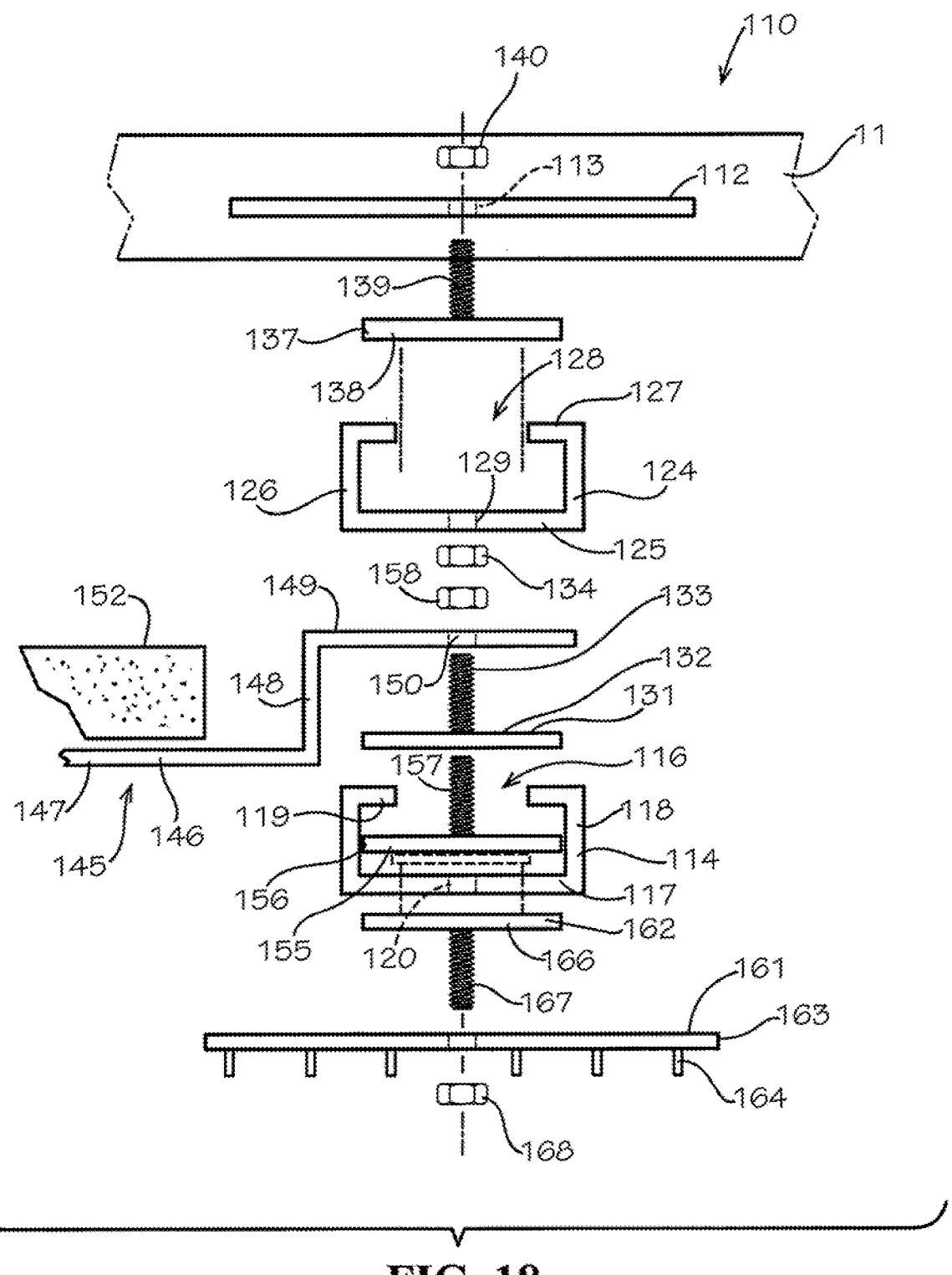
FIG. 18 is an exploded, end view of the mounting system of FIG. 17.

With reference next to FIGS. 17 and 18, there is a shown a solar panel 11 and mounting system 110 in another preferred form of the invention. Here, the mounting system 110 includes a side edge mounting bracket 112 which may be formed as part of the solar panel 11, but which alternatively may be formed similar to bracket 50 shown in FIGS. 9 and 10. The mounting bracket 112 includes a mounting hole 113 therethrough. In this embodiment, the mounting system 110 includes ballast; therefore, the need for a welding strip is optional.

The system 110 includes a generally U-shaped, elongated base plate 114 having an elongated mounting slot or channel 116 defined by a generally planar, elongated base member 117 and two oppositely disposed elongated, vertically oriented channel walls 118 having inwardly extending lips or flanges 119. The base member 117 includes a series of elongated mounting holes 120. It should be understood that the system includes pairs of like components to complete the system, i.e., pairs of base members 117, spacers beams 124, corresponding fasteners, and the like.

The system also includes an elongated U-shaped spacer beam or rail 124 having a horizontal lower member 125, two oppositely disposed side walls 126 each having an inwardly extending lip or flange 127 defining a slot or channel 128 therebetween. The lower member 125 has mounting holes 129 therethrough. A first T-shaped fastener 131 having an elongated mounting plate 132 and an externally threaded mounting post 133 which extends through the spacer beam mounting hole 129 and is threadably coupled to an internally threaded first mounting nut 134. The spacer beam 124 is selectively, releasably coupled to and slideable relative to the underlying and longitudinally aligned base member 117 for slideable movement therebetween through a force placed upon the spacer beam 124 through the loosening of first mounting nut 134 and locked in place by the tightening of first mounting nut 134. The width of the mounting plate 132 is slightly smaller than the size (width) of the mounting slot 116 while the length of the mounting plate 132 is larger than the size (width) of the mounting slot 116, so that the mounting plate 132 may be passed through the slot 116 and then rotated so that it then cannot pass back through the slot 116. The corners of the mounting plate 132 are rounded so that they may bear against the interior surface of the channel walls 118.

A second T-shaped fastener 137 having an elongated mounting plate 138 and an externally threaded mounting post 139 is coupled to the spacer beam 124. The threaded mounting post 139 extends through the slot 128, through the mounting hole 113 in mounting bracket 112 and is threadably coupled to an internally threaded second mounting nut 140. The solar panel 11 is selectively, releasably coupled to and slideable relative to the underlying spacer beam 124 for slideable movement therebetween for mounting and adjustment purposes through the loosening of second mounting nut 140 and locked in place by the tightening of second mounting nut 140. The width of the mounting plate 138 is slightly smaller than the size (width) of the mounting slot 128 while the length of the mounting plate 138 is larger than the size (width) of the mounting slot 128, so that the mounting plate 138 may be passed through the slot 128 and then rotated so that it then cannot pass back through the slot 128. The corners of the mounting plate 138 are rounded so that they may bear against the interior surface of the spacer beam side walls 126.

The mounting system 110 also includes a ballast system 145 which is releasably and slideably coupled to the base member 117. The ballast system 145 includes a ballast tray 146 having a floor 147, two oppositely disposed side walls 148 and a mounting flange 149 extending outwardly from each side wall 148. Each mounting flange 149 has two mounting holes 150 therethrough. One of more ballast modules 152, preferably in the form of concrete slabs, may be positioned upon the floor 147 of the ballast tray 146, to provide adequate weight to prevent the solar panels 11 and the mounting system 110 from being displaced. The ballast tray 146 may be made of a metal or other suitable material.

A third T-shaped fastener 155 having an elongated mounting plate 156 and an externally threaded mounting post 157 which extends through the ballast tray mounting hole 150 and is threadably coupled to an internally threaded third mounting nut 158. The ballast tray 146 is selectively, releasably coupled to and slideable relative to the underlying base member 117 for slideable movement therebetween through a force placed upon the ballast tray 146 through the loosening of third mounting nut 158 and locked in place by the tightening of third mounting nut 158. The width of the mounting plate 156 is slightly smaller than the size (width) of the mounting slot 116 while the length of the mounting plate 156 is larger than the size (width) of the mounting slot 116, so that the mounting plate 156 may be passed through the slot 116 and then rotated so that it then cannot pass back through the slot 116. The corners of the mounting plate 156 are rounded so that they may bear against the interior surface of the channel walls 118.

Lastly, the mounting system 110 includes anti-creep strips 161 which are coupled to each base member 117 through fourth T-shaped fasteners 162. The anti-creep strips 161 include a generally planar support 163 and an array or arrangement of downwardly extending feet or projections 164. The anti-creep strip 161 may be made of a polymer material or the like. The fourth T-shaped fastener 162 have an elongated mounting plate 166 and an externally threaded mounting post 167 which extends through the base member elongated mounting holes 120 and is threadably coupled to an internally threaded fourth mounting nut 168. The width of the mounting plate 166 is slightly smaller than the size (width) of the mounting slot 116 while the length of the mounting plate 166 is larger than the size (width) of the mounting slot 116, so that the mounting plate 166 may be passed through the slot 116 with the mounting post 167 extending through the elongated mounting hole 120 and secured with fourth nut 168 to secure the anti-creep strip 161 to the base plate 114. The corners of the mounting plate 132 are rounded so that they may bear against the interior surface of the channel walls 118.

Figure 20:
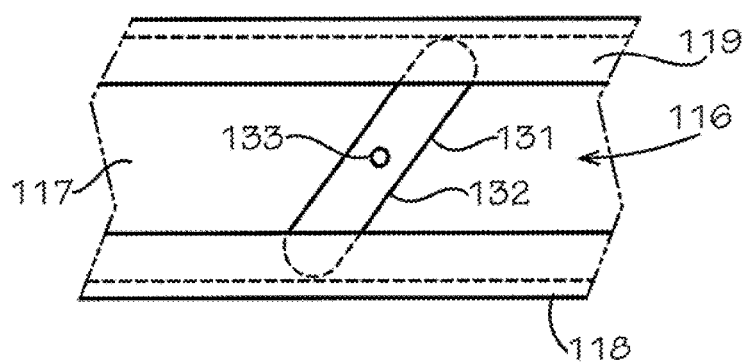
FIG. 20 is a top view of a portion of the mounting system of FIG. 17.

It should be understood that the first, second, third and fourth T-shaped fasteners 131, 137, 155, and 162 are preferably all the same to provide less inventory and easy exchange of pieces. These fasteners pass through the slots or holes (113, 116, and 128) and bind upon rotation so that they do not need to be held in place with a tool during installation, as shown in FIG. 20.

In use, the anti-creep strip 161 prevents relative movement of the mounting system 110 relative to the tufted geosynthetic material. The array of downwardly extending feet or projections 164 inter-engage with the tufts for frictionally resisting movement relative to the tufted geosynthetic.

Figure 19:
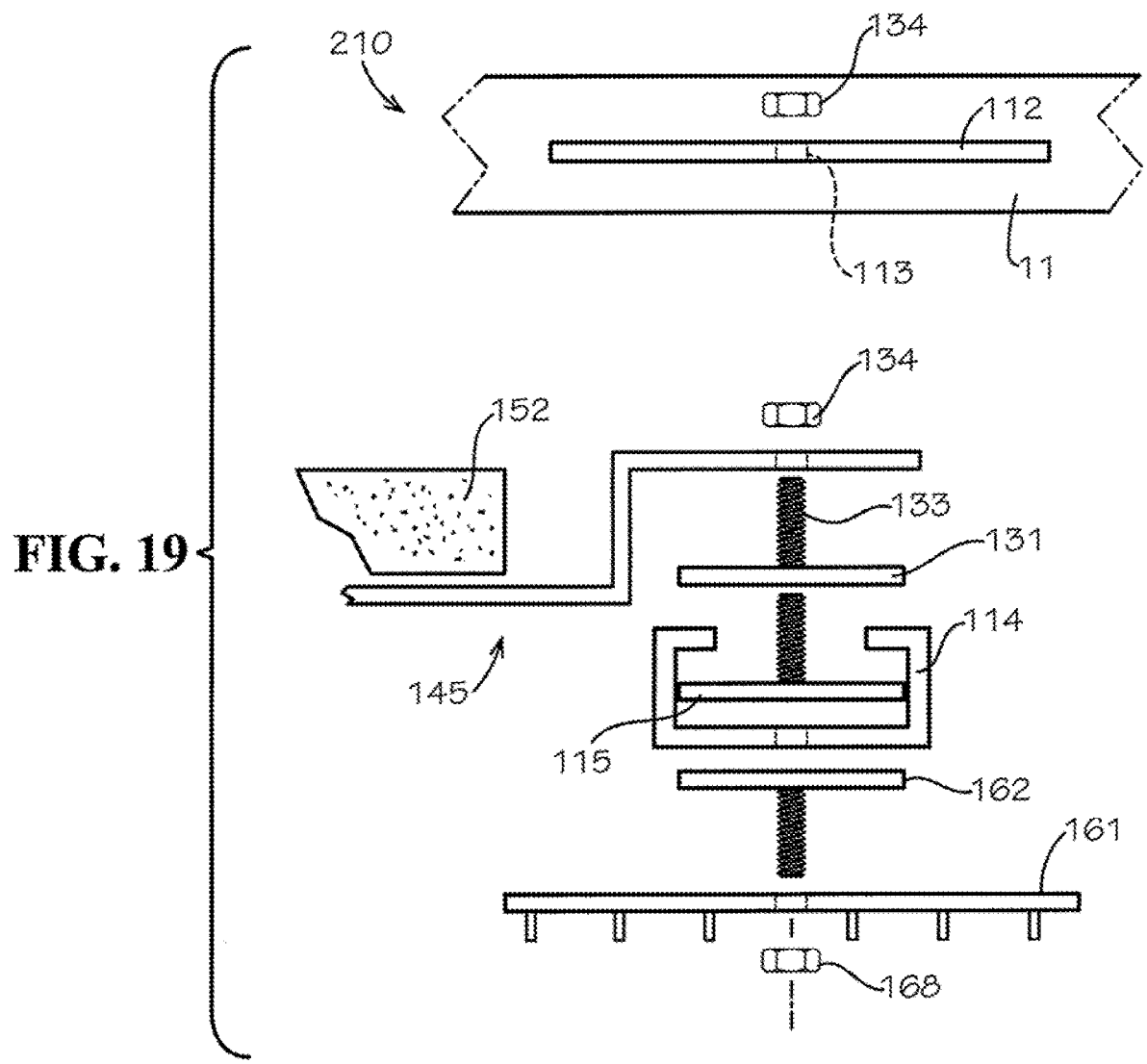
FIG. 19 is an end view of the mounting system of FIG. 17 shown with the spacer removed.

With reference next to FIG. 19, there is a shown a solar panel 11 and mounting system 210 in another preferred form of the invention. Here, the mounting system 210 is essentially the same as that shown in reference to FIGS. 17 and 18 except that the spacer beam 124 and its correlating parts are not included.

With the absence of the spacer beam 124, the first T-shaped fastener 131 is coupled directly to the solar panel 11 with the mounting post 133 extending through the mounting hole 113 within the solar panel mounting bracket 112. The first mounting nut 134 is threaded upon the mounting post 133 to secure the solar panel 11 in place. This configuration may be preferred when a large amount of ventilation below the solar panel is not required.

Figure 21:
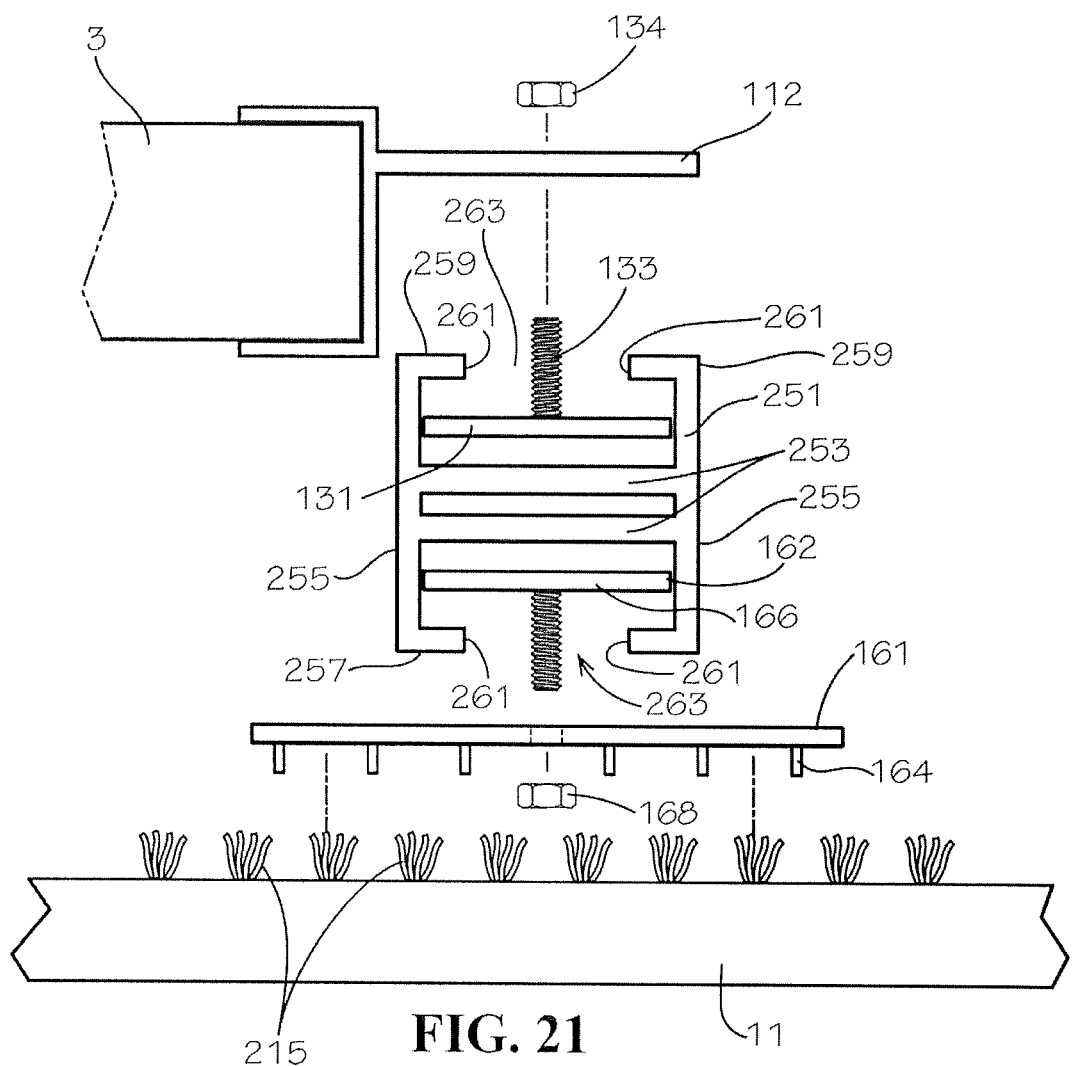
FIG. 21 is a perspective view of an alternate embodiment of a rail for use with photovoltaic module mounting system in yet another preferred form.

FIG. 21 illustrates an end view of an alternate embodiment of the mounting system shown in FIG. 17, using a one-piece extruded rail 251 (as the base plate referenced above). The rail 251 comprises an elongated member having at least one web 253 attached to opposing side walls 255. The illustrated embodiment includes a pair of webs 253. The sides walls 255 define a channel 256 and opposing profiles for a base 257 for contacting the attaching connection 188 and an opposing seat 259 for connecting to the bracket 112 of the photovoltaic module 11. The bracket 112 may be integral with the photovoltaic module 11 as supplied by the module manufacturer, or may be part of a Y-shaped bracket similar to bracket 50 shown in FIGS. 9 and 10 for engaging a side edge of the module.

The side walls 255 have inwardly extending lips or flanges 261, respectively, and each pair defines a respective slot 263 therebetween for the base 257 and for the seat 259. A plurality of fasteners 162 secure the rail 251 to the anti-creep strip 161. The post of the fastener extends though the slot 263 and through the anti-creep strip 161. Upon rotating, the plate 166 on the flanges 261 bears on the side walls 255, and the nut 168 threads on the post to secure the attaching connection 188 to the rail 251. The feet 164 extending from the anti-creep strip than engages the tufts 215 of the geosynthetic cover 11. The photovoltaic module 3 then rests with the bracket 112 on the seat 259. A post 133 of a fastener 131 extends upwardly through the slot 263 in the seating end 259, and through the opening in the bracket 112. The plate 132 rotates into engagement with the side walls 255. The nut 134 threadably engages the post 133 to secure the photovoltaic module 11 to the rail. Although not illustrated, a spring attached to the plate may assist by holding the plate between the web 253 and the flanges 261 in contact with the flanges 261 until the nut secures the fastener to the rail.

It should be understood that in these embodiments the weld harness strip is preferably made of a polyethylene material. Similarly, the yarns of the tufted geosynthetic material are also made of a polyethylene material. With this construction, the melting point of the weld harness strip is generally that of the yarns of the tufted geosynthetic material, thereby creating a superior bold or weld there between. However, it should be understood that other types of polymer materials may also be used for these components without departing from the scope of the invention.

The distinct advantage to the invention described in the multiple embodiments herein is that the solar panels may be positioned or arranged in a manner that provides for a higher density of solar panels per area of land. This higher density allows for the generation of more electricity per land area. Another advantage is the easy of mounting solar panels without the need for a racking system or without the occurrence of panel movement over time.

The wind breaking element, such as members 219, readily attach to the photovoltaic module 3, or alternatively, to the bracket 50 or 112, for wind uplift resistance, by creating turbulent flow near the surface of the cover, thus greatly reducing the actual wind velocity at the cover surface and decreasing associated uplift.

In all embodiments wherein two base plates, spacers, or rails are shown, it should be understood that the invention may include at least one such component, however, such an arrangement is not preferred.

This invention has been described with particular reference to certain embodiments, but variations and modifications can be made without departing from the spirit and scope of the invention.

The invention claimed is:

1. An integrated photovoltaic module mounting system for use in mounting a photovoltaic module to tufted geosynthetics, comprising:
    at least one elongated base plate;
    at least one elongated rail, said elongated rail coupled to and longitudinally aligned with said at least one elongated base plate;
    a photovoltaic module;
    a plurality of photovoltaic module fasteners coupling the photovoltaic module with said rail, and
    an anti-creep strip coupled to a bottom surface of said at least one elongated base plate, said anti-creep strip comprising a plurality of spaced-apart feet extending from the bottom surface for positioning on a portion of a tufted geosynthetics having a plurality of tufts with the plurality of spaced-apart feet in frictional engagement therewith, said tufted geosynthetics for covering a surface,
    wherein the photovotanic module generates electricity and the anti-creep strip inter-engaged with tufts of the tufted geosynthetics resists wind uplift.

2. The integrated photovoltaic module mounting system of claim 1 wherein said at least one elongated rail includes an elongated rail slot having a width, and wherein each of said photovoltaic module fasteners include a mounting plate having a selected width smaller than the width of said elongated rail slot and a length larger than the width of said elongated rail slot.

3. An integrated photovoltaic module mounting system for use in mounting a photovoltaic module to tufted geosynthetics, comprising:
    at least one elongated first rail;
    a photovoltaic module having a connecting bracket configured for coupling to said at least elongated first rail;
    a plurality of first fasteners for coupling said at least one elongated first rail with the photovoltaic module; and
    an anti-creep strip coupled to a bottom surface of said at least one elongated rail, said anti-creep strip comprising a plurality of feet extending from the bottom surface thereof for engaging tufts of a tufted geosynthetic overlying a surface.

4. The integrated photovoltaic module mounting system of claim 3 wherein said at least one elongated rail includes an elongated slot having a width, and wherein each of said first fasteners include a mounting plate having a selected width smaller than the width of said slot and a length larger than the width of said slot.

5. The integrated photovoltaic module mounting system of claim 3 further comprising an elongated second rail, said elongated second rail being coupled to said at least one elongated first rail and a plurality of second fasteners coupling said elongated second rail with said at least one elongated first rail, and wherein the photovoltaic module is coupled to said at least one elongated first rail through said elongated second rail and said plurality of second fasteners.

6. The integrated photovoltaic module mounting system of claim 5 wherein said elongated second rail includes an elongated second rail slot having a width and wherein each of said second fasteners includes a mounting plate having a selected width smaller than the width of said second rail slot and a length larger than the width of said second rail slot.

7. The integrated photovoltaic module mounting system of claim 4 further comprising a plurality of second fasteners coupling said elongated first rail to said anti-creep strip.

8. An integrated photovoltaic module mounting system for use in mounting a photovoltaic module to tufted geosynthetics, comprising:
    at least one elongated base plate having a base member, two opposing side walls each having an inwardly extending lip to define a base plate slot therebetween having a slot width;
    a plurality of first fasteners for coupling said at least one elongated base plate with a photovoltaic module, said first fasteners having a mounting plate with a width less than said slot width and a length greater than said slot width; and
    an anti-creep strip coupled to a bottom surface of said at least one elongated base plate, said anti-creep strip including a support and a plurality of projections depending downwardly from said support.

9. The integrated photovoltaic module mounting system of claim 8 further comprising at least one elongated rail, said at least one elongated rail for coupling between said at least one elongated base plate and the photovoltaic module.

10. The integrated photovoltaic module mounting system of claim 9 wherein said at least one elongated rail includes an elongated rail slot having a width and further comprising a plurality of second fasteners for coupling said at least one elongated base plate to said at least one elongated rail.

11. The integrated photovoltaic module mounting system of claim 10 wherein said base plate includes a base plate slot having a width and further comprising a plurality of third fasteners coupling said anti-creep strip to said at least one elongated base plate, each said third fastener having a mounting plate having a width smaller than the width of said base plate slot and a length larger than the width of said base plate slot.

12. The integrated photovoltaic module mounting system of claim 1, wherein the at least one elongated base plate and the at least one elongated rail are separate; and further comprising a plurality of rail fasteners coupling said at least one elongated base plate and said at least one elongated rail.

13. The integrated photovoltaic module mounting system of claim 1, further comprising a plurality of rail fasteners for coupling said at least one elongated rail to the at least one base plate.

14. The integrated photovoltaic module mounting system of claim 1 further comprising a plurality of anti-creep strip fasteners for coupling said anti-creep strip to said at least one base plate.

15. The integrated photovoltaic module mounting system of claim 7, wherein said elongated first rail includes a rail slot having a length and a width, and each said second fastener includes a mounting plate having a selected width smaller than the width of said rail slot and a length larger than the width of said rail slot.

16. The integrated photovoltaic module mounting system of claim 10, wherein said at least one elongated rail includes a rail slot having a width, and wherein each of said second fasteners includes a mounting plate having a width smaller than the width of said rail slot and a length larger than the width of said rail slot.

17. The integrated photovoltaic module mounting system of claim 14, wherein said at least one base plate includes an elongated base plate slot having a width and wherein each of said anti-creep strip fasteners includes a mounting plate having a selected width smaller than the width of said base plate slot and a length larger than the width of said base plate slot.

18. A method of mounting a photovoltaic module for use with tufted geosynthetics, comprising the steps of:
(a) coupling an anti-creep strip to a bottom surface of an elongated rail;
(b) positioning the anti-creep strip onto a portion of a tufted geosynthetics covering a surface, said anti-creep strip comprising a plurality of spaced-apart feet extending from the bottom surface for positioning on a portion of the tufted geosynthetics having a plurality of tufts with the plurality of spaced-apart feet in frictional engagement therewith; and
(c) coupling a photovotanic module to the elongated rail, wherein the photovotanic module generates electricity and the anti-creep strip inter-engaged with the tufts of the tufted geosynthetics resists wind uplift.

19. An integrated photovoltaic module mounting system engaged a tufted geosynthetics ground cover system, comprising:
a tufted geosynthetics ground cover system comprising a geotextile tufted with yarns to define a plurality of spaced-apart tufts extending from an upper surface as synthetic blades;
at least one elongated base plate;
at least one elongated rail, said elongated rail coupled to and longitudinally aligned with said at least one elongated base plate;
a photovoltaic module;
a plurality of photovoltaic module fasteners coupling the photovoltaic module with said at least one elongate rail; and
an anti-creep strip coupled to a bottom surface of said at least one elongated base plate, said anti-creep strip positioned on a portion of the tufted geosynthetics ground cover system,
wherein the photovotanic module generates electricity and the anti-creep strip inter-engaged with tufts of the tufted geosynthetics resists wind uplift.

20. The integrated photovoltaic module mounting system of claim 19, wherein the at least one elongated base plate and the at least one elongated rail are separate; and further comprising a plurality of rail fasteners coupling said at least one elongated base plate and said elongated rail.

21. The integrated photovoltaic module mounting system of claim 20, wherein said at least one elongated base plate includes an elongated base plate slot and wherein said rail fasteners include a mounting plate having a selected width smaller than the width of said base plate slot and a length larger than the width of said base plate slot.

22. The integrated photovoltaic module mounting system of claim 21 wherein said at least one elongated rail includes an elongated rail slot having a width, and wherein each of said photovoltaic module fasteners includes a second mounting plate having a selected width smaller than the width of said elongated rail slot and a length larger than the width of said elongated rail slot.

* * * * *